(12) United States Patent
Degai

(10) Patent No.: US 9,984,887 B2
(45) Date of Patent: May 29, 2018

(54) METHOD OF MANUFACTURING A SEMICONDUCTOR DEVICE

(71) Applicant: HITACHI KOKUSAI ELECTRIC INC., Tokyo (JP)

(72) Inventor: Motomu Degai, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 15/273,780

(22) Filed: Sep. 23, 2016

(65) Prior Publication Data

US 2017/0092503 A1 Mar. 30, 2017

(30) Foreign Application Priority Data

Sep. 29, 2015 (JP) ................. 2015-191266

(51) Int. Cl.
| H01L 21/285 | (2006.01) |
| H01L 21/28 | (2006.01) |
| C23C 16/455 | (2006.01) |
| C23C 16/06 | (2006.01) |

(52) U.S. Cl.
CPC ........ H01L 21/28562 (2013.01); C23C 16/06 (2013.01); C23C 16/455 (2013.01); H01L 21/28088 (2013.01); H01L 21/28568 (2013.01)

(58) Field of Classification Search
CPC ......... H01L 21/28562; H01L 21/28568; H01L 21/28088; H01L 21/3141; H01L 21/02274; H01L 21/0228; H01L 21/31604; H01L 21/76846; H01L 21/76855; H01L 21/76856; H01L 21/28556; H01L 21/2856; C23C 16/06; C23C 16/455;

(Continued)

(56) References Cited

U.S. PATENT DOCUMENTS 8,951,912 B2 2/2015 Ogawa et al.
2006/0292864 A1* 12/2006 Yang ................ C23C 16/06
438/653

(Continued)

FOREIGN PATENT DOCUMENTS

JP 2011-006783 A 1/2011

*Primary Examiner* — Caleen Sullivan
(74) *Attorney, Agent, or Firm* — Volpe and Koenig, P.C.

(57) ABSTRACT

A method of manufacturing a semiconductor device includes: forming a film on a substrate by time-divisionally and sequentially performing: (a) supplying a precursor gas to the substrate and causing precursor molecules, which are contained in the precursor gas and which contains a main element and ligands, to be adsorbed onto the substrate; (b) supplying a compound containing an electron withdrawing group to the substrate onto which the precursor molecules are adsorbed, and causing the compound containing the electron withdrawing group to be adsorbed to the ligands contained in the precursor molecules; and (c) supplying a reaction gas to the substrate onto which the precursor molecules and the compound containing the electron withdrawing group are adsorbed, causing the ligands and the compound containing the electron withdrawing group to be desorbed from the substrate, and causing the main element contained in the precursor molecules to react with the reaction gas.

10 Claims, 8 Drawing Sheets

(58) Field of Classification Search
CPC ........ C23C 16/45542; C23C 16/45553; C23C 16/32; C23C 16/45527; C23C 16/45525
USPC ........................................................ 438/674
See application file for complete search history.

(56) References Cited

U.S. PATENT DOCUMENTS

| | | | |
|---|---|---|---|
| 2008/0102204 A1* | 5/2008 | Elers | ................. C23C 16/32 427/249.1 |
| 2010/0297846 A1 | 11/2010 | Kaga et al. | |
| 2016/0079070 A1 | 3/2016 | Ogawa et al. | |

* cited by examiner

METHOD OF MANUFACTURING A SEMICONDUCTOR DEVICE

CROSS-REFERENCE TO RELATED APPLICATION

This application is based upon and claims the benefit of priority from Japanese Patent Application No. 2015-191266, filed on Sep. 29, 2015, the entire contents of which are incorporated herein by reference.

TECHNICAL FIELD

The present disclosure relates to a method of manufacturing a semiconductor device.

BACKGROUND

In a semiconductor device including a transistor such as a MOSFET (Metal-Oxide-Semiconductor Field Effect Transistor) or the like, use of various kinds of thin films has been studied alone with the high integration and the high performance thereof. For example, a metal film is widely used as a gate electrode of a MOSFET or a capacitor electrode film of a DRAM (Dynamic Random Access Memory) capacitor.

However, when a thin film is formed on a substrate, there may be a case where the removal of ligands contained in a precursor is insufficient, and a case where the ligands remain as an impurity in the film. For example, in the case of a metal film, there may be a case where residual ligands become a factor to increase the resistivity of a thin film.

SUMMARY

The present disclosure provides some embodiments of a technique capable of forming a high-quality thin film by increasing the removal efficiency of ligands contained in a precursor when a thin film is formed on a substrate.

According to one embodiment of the present disclosure, there is provided a method of manufacturing a semiconductor device, including: forming a turn on a substrate by time-divisionally and sequentially performing: (a) supplying a precursor gas to the substrate and causing precursor molecules, which are contained in the precursor gas and which contains a main element and ligands, to be adsorbed onto the substrate; (b) supplying a compound containing an electron withdrawing group to the substrate onto which the precursor molecules are adsorbed, and causing the compound containing the electron withdrawing group to be adsorbed to the ligands contained in the precursor molecules; and (c) supplying a reaction gas to the substrate onto which the precursor molecules and the compound containing the electron withdrawing group are adsorbed, causing the ligands and the compound containing the electron withdrawing group to be desorbed from the substrate, and causing the main element contained in the precursor molecules to reset with the reaction gas.

DETAILED DESCRIPTION

When a thin film is formed on a substrate by alternately supplying a precursor gas and a reaction gas (reactant) to the substrate so that the precursor gas and the reaction gas are not mixed with each other, there may be a case where ligands contained in molecules of the precursor gas are not sufficiently removed bat remain as ah impurity in the film while being bonded to a main element of the precursor gas that become elements constituting the thin film. In particular, this problem may conspicuously occur in a precursor gas which is hardly pyrolized due to the strong bond between a main element and ligands. If a thin film formed on a substrate is a metal film, a residual impurity may become a factor that increases the resistivity of the film.

The present inventors have conducted extensive research and have found that, in a state in which precursor molecules (e.g., a titanium (Ti)-containing gas) are adsorbed onto a substrate, the removal efficiency of ligands can be improved by supplying a catalyst, which has an action (catalytic action) of weakening the bond between a main element (Ti in the case of the Ti-containing gas) of the adsorbed precursor molecules and ligands. By using a compound having an electron withdrawing group as the catalyst, it is possible to reduce an electron density of atoms constituting ligands and to increase a dissociation constant, thereby weakening the bond between a main element and ligands. Thus, when a reaction gas is supplied, the ligands are easily removed. It is therefore possible to restrain the ligands from being introduced into a film as an impurity. The compound having an electron withdrawing group may be an acid-based gas, specifically, a Lewis acid gas (having a site for recess ins an electron pair). By using the Lewis acid gas, it is possible to receive (or remove) unpaired electrons of atoms constituting ligands, thereby weakening the bond between a main element and ligands. In this way, after the precursor molecules are adsorbed onto the substrate, the bond between the main element of the adsorbed precursor molecules and the ligands are weakened. In this state, the reaction gas and the precursor molecules are caused to react with each other. By doing so, the ligands are easily removed when the reaction gas is supplied. Accordingly, it is possible to increase the removal efficiency of ligands while sufficiently obtaining an adsorption amount of the main element of the precursor molecules. The details will be described herein below.

First Embodiment of the Present Disclosure

Figure 1:
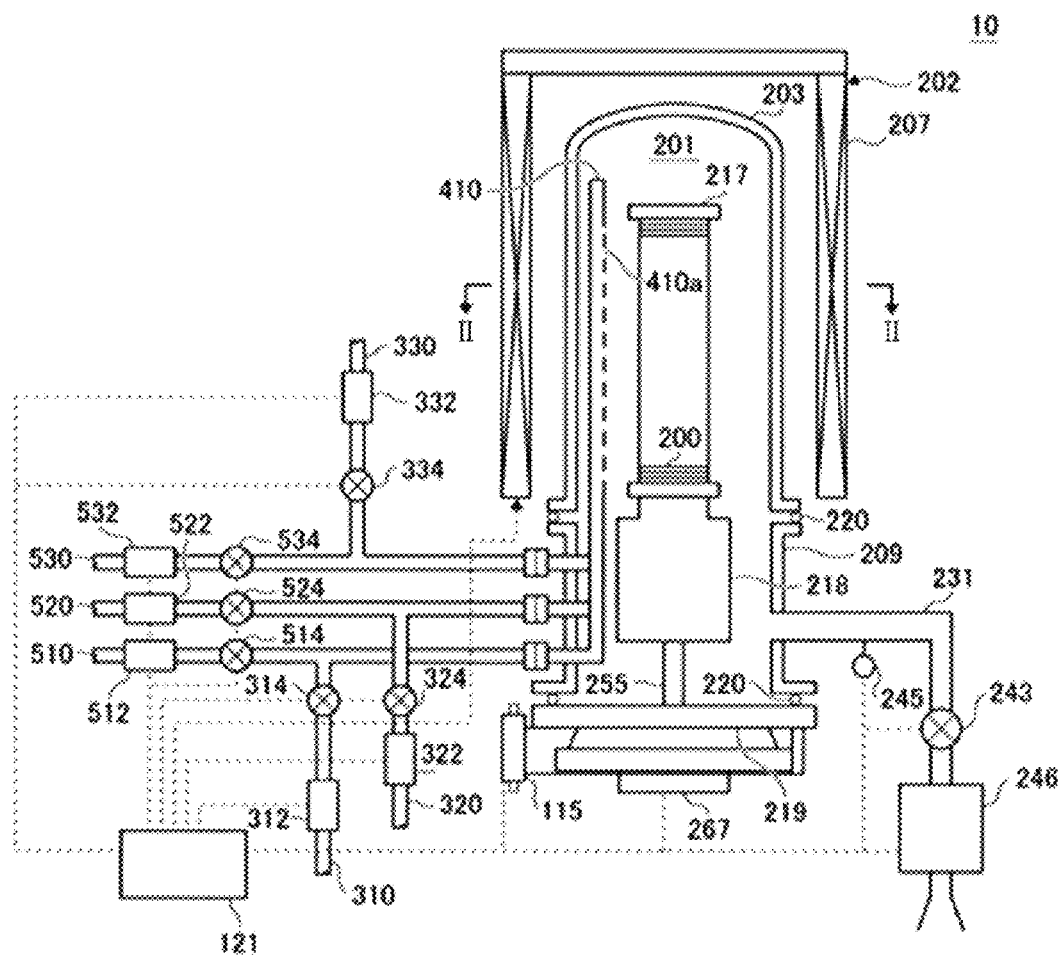
FIG. 1 is a schematic configuration view of a processing furnace of a substrate processing apparatus used in a first embodiment of the present disclosure, in which a portion of the processing furnace is shown in a vertical cross section.
Figure 2:
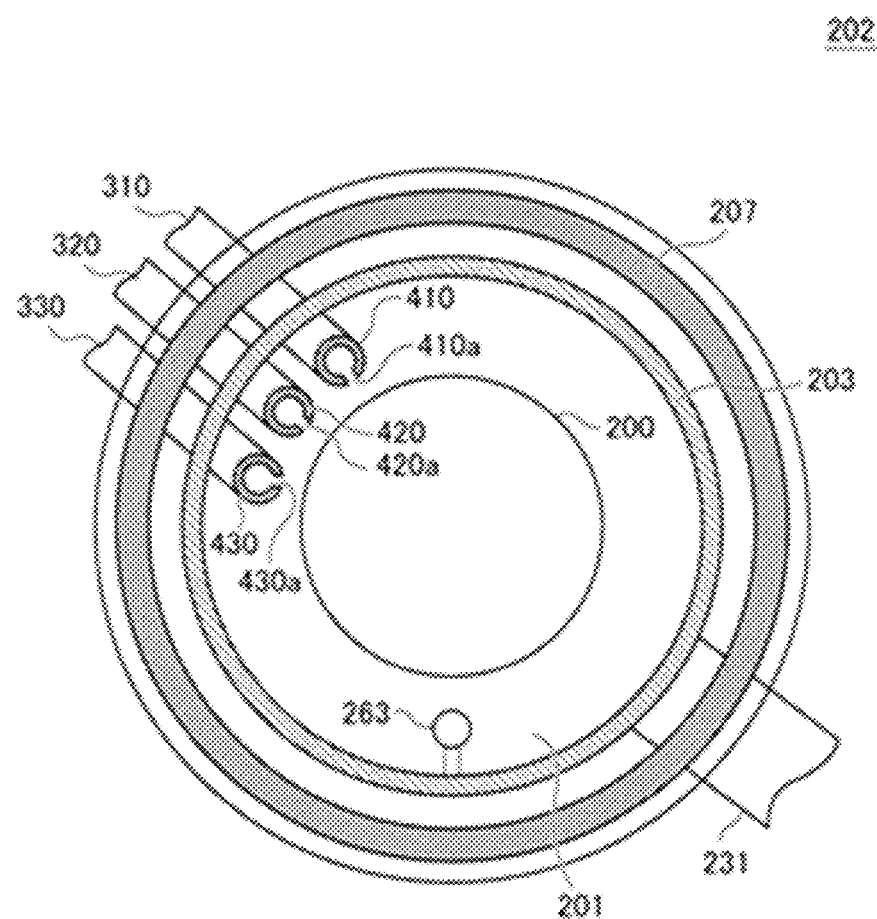
FIG. 2 is a sectional view taken along line II-II in FIG. 1.

Hereinafter, a first embodiment of the present disclosure will be described with reference to FIGS. 1 and 2. A substrate processing apparatus 10 is configured as one example of an apparatus used in a substrate processing process which is one type of manufacturing process of a semiconductor device.

(1) Configuration of Processing Furnace

A heater 207 as a heating means (a heating mechanism or a heating system) is installed in a processing furnace 202. The heater 207 is formed in a cylindrical shape with the upper side thereof closed.

A reaction lube 203 that constitutes a reaction vessel (process vessel) is disposed inside the heater 207 in a concentric relationship with the heater 207. The reaction rube 203 is made of a heat-resistant material (e.g., quartz ($SiO_2$) or silicon carbide (SiC)) and is formed in a cylindrical shape with the ripper end thereof closed and the lower end thereof opened. At the lower side of the reaction tube 203, a manifold (inlet flange) 209 is disposed in a concentric relationship with the reaction tube 203. The manifold 209 is made of, for example, metal such as stainless steel (SUS) or the like and is formed in a cylindrical shape with the upper and lower ends thereof opened. The upper end portion of the manifold 209 engages with the lower end portion of the reaction tube 203 so as to support the reaction tube 203. An O-ring 220*a* as a seal member is installed between the manifold 209 and the reaction tube 203. The manifold 209 is supported by a heater base, whereby the reaction tube 203 comes into a vertically installed state. The process vessel (reaction vessel) is mainly configured by the reaction tube 203 and the manifold 209. A process chamber 201 is formed in the cylindrical hollow portion of the process vessel.

The process chamber 201 is configured to accommodate wafers 200 as substrates which are aligned in a horizontal posture and in multiples stages along a vertical direction by a boat 217 to be described later.

Nozzles 410, 420 and 430 are installed in the process chamber 201 so as to penetrate a sidewall of the manifold 209. Gas supply pipes 310, 320 and 330 as gas supply lines are respectively connected to the nozzles 410, 420 and 430. In this way, three nozzles 410, 420 and 430 and three gas supply pipes 310, 320 and 330 are installed in the processing furnace 202 so that plural kinds of gases, specifically three kinds of gases (process gases and precursors), can be supplied into the process chamber 201.

Mass flow controllers (MFCs) 312, 322 and 332 as flow rate controllers (flow rate control parts), and valves 314, 324 and 334 as opening/closing valves are installed in the gas supply pipes 310, 320 and 330 sequentially from the corresponding upstream sides, respectively. Gas supply pipes 510, 520 and 530 configured to supply an inert gas are respectively connected to the gas supply pipes 310, 320 and 330 at the downstream side of the valves 314, 324 and 334. MFCs 512, 522 and 532 as flow rate controllers (flow rate control parts), and valves 514, 524 and 534 as opening/closing valves, are installed in the gas supply pipes 510, 520 and 530 sequentially from the corresponding upstream sides, respectively.

The nozzles 410, 420 and 430 are respectively connected to tip portions of the gas supply pipes 310, 320 and 330. The nozzles 410, 420 and 430 are configured as L-shaped long nozzles. The horizontal portions of the nozzles 410, 420 and 430 are installed so as to penetrate the sidewall of the manifold 209. The vertical portions of the nozzles 410, 420 and 430 are installed in an annular space defined between the inner wall of the reaction tube 203 and the wafers 200, so as to extend upward (toward an upper side in a stacking direction of the wafers 200) along the inner wall of the reaction tube 203 (namely, so as to extend upward from one end side toward, the other end side of a wafer arrangement region). That is to say, the nozzles 410, 420 and 430 are installed in a region existing at a lateral side of a wafer arrangement region, in which the wafer 200 are arranged, and horizontally surrounding the wafer arrangement region, so as to extend along the wafer arrangement region.

Gas supply holes 410*a*, 420*a* and 430*a* configured to supply (inject) gases are respectively installed in the side surfaces of the nozzles 410, 420 and 430. The gas supply holes 410*a*, 420*a* and 430*a* are respectively opened toward the center of the reaction tube 203. A plurality of the gas supply holes 410*a*, 420*a* and 430*a* are formed from the lower portion of the reaction tube 203 to the upper portion thereof. The respective gas supply holes 410*a*, 420*a* and 430*a* have the same opening area. Furthermore, the respective gas supply holes 410*a*, 420*a* and 430*a* are disposed at the same opening pitch.

In a gas supply method according to the present embodiment gases are transferred via the nuzzles 410, 420 and 430 which are disposed within a vertically-elongated space having an annular shape in a plane view, namely a cylindrical space, defined by the inner wall of the reaction tube 203 and the end portions of the mounted wafers 200. The gases are initially injected from the gas supply holes 410*a*, 420*a* and 430*a*, which are respectively opened in the nozzles 410, 420 and 430 into the reaction tube 203 near the wafers 200. The main streams of the gases within the reaction tube 203 are oriented in a direction parallel to the surfaces of the wafers 200, namely in a horizontal direction. With this configuration, there is provided an effect in that it is possible to uniformly supply the gases to the respective wafers 200 and to make the film thickness of a thin film formed on each of the wafers 200 uniform. In addition, the gases which have flowed over the surfaces of the respective wafers 200, namely the gases remaining after a reaction (residual gases), are moved toward an exhaust port (exhaust pipe 231) which will be described later. The flow direction of the residual gases may be appropriately specified depending on the position of at exhaust port and is not limited to a vertical direction.

As one example of the aforementioned configuration, a precursor gas as a process gas is supplied from the gas supply pipe 310 into the process chamber 201 via the MFC 312, the valve 314 and the nozzle 410. As the precursor gas, it may be possible to use an organic precursor gas (organic compound), for example, a gas containing a metal element (a metal-containing gas). As the metal element, it may possible to use, for example, tetrakis(diethylamino)titanium (TDEAT) which is a gas containing titanium (Ti) (a titanium (Ti)-containing precursor, a Ti-containing precursor gas, a Ti-containing gas or a Ti source). When the term "precursor" is used herein, it may refer to a "liquid precursor staying in a liquid state", a "precursor gas staying in a gaseous state", or both.

As a process gas, a reaction gas reacting with the precursor gas is supplied from the gas supply pipe 320 into the process chamber 201 via the MFC 322, the valve 324 and the nozzle 420. As the reaction gas, it may be possible to use a nitriding agent (nitriding gas) which is a gas containing nitrogen (N) (an N-containing gas or an N source), for example, ammonia ($NH_3$).

As a process gas, a catalyst, which is a gas capable of weakening the bond between a main element of the precursor gas and ligands, which has an electron withdrawing group and which may be an acid-based, gas, specifically, a Lewis acid gas (also simply referred to as "Lewis acid"), is supplied from the gas supply pipe 330 into the process chamber 201 via the MFC 332, the valve 334 and the nozzle 430. As the catalyst, it may be possible to use, for example, boron trichloride ($BCl_3$).

As an inert gas, for example, a nitrogen ($N_2$) gas is supplied from the carrier gas supply pipes 510, 520 and 530 into the process chamber 201 via the MFCs 512, 522 and 532, the valves 514, 524 and 534 and the nozzles 410, 420 and 430.

In the case where the aforementioned process gases are supplied from the gas supply pipes 310, 320 and 330, a process gas supply system is mainly configured by the gas supply pipes 310, 320 and 330, the MFCs 312, 322 and 332, and the valves 314, 324 and 334. The nozzles 410, 420 and 430 may be included in the process gas supply system. The process gas supply system may be simply referred to as a gas supply system.

In the case where the precursor gas as the process gas is supplied from the gas supply pipe 310, a precursor gas supply system is mainly configured by the gas supply pipe 310, the MFC 312 and the valve 314. The nozzle 410 may be included in the precursor gas supply system. In the case where the organic precursor gas as the process gas is supplied front the gas supply pipe 310, the precursor gas supply system may be referred to as an organic precursor gas supply system. In the case where the metal-containing gas as the organic precursor gas is supplied from the gas supply pipe 310, the organic precursor gas supply system may be referred to as a metal-containing-gas supply system. In the case where the Ti-containing gas is supplied Item the gas supply pipe 310, the metal-containing-gas supply system may be referred to as a Ti-containing-gas supply system. In the case where the TDEAT gas is supplied from the gas supply pipe 310, the Ti-containing-gas supply system may be referred to as a TDEAT gas supply system. The TDEAT gas supply system may be referred to as a TDEAT supply system.

In the case where the reaction gas (reactant) as the process gas is supplied from the gas supply pipe 320, a reaction gas supply system is mainly configured by the gas supply pipe 320, the MFC 322 and the valve 324. The nozzle 420 may be included in the reaction gas supply system. In the case where the N-containing gas as the reaction gas is supplied from the gas supply pipe 320, the reaction gas supply system may be referred to as an N-containing-gas supply system. In the case where the $NH_3$ gas is supplied from the gas supply pine 320, the N-containing-gas supply system may be referred to as an $NH_3$ gas supply system. The $NH_3$ gas supply system may be referred to as an $NH_3$ supply system.

In the case where the catalyst as the process gas is supplied from the gas supply pipe 330, a catalyst supply system is mainly configured by the gas supply pipe 330, the MFC 332 and the valve 334. The nozzle 430 may be included in the catalyst supply system. In the case where the acid-based gas as the catalyst is supplied from the gas supply pipe 330, the catalyst supply system may be referred to as an acid-based-gas supply system. In the case where the Lewis acid gas is used as the acid-based gas, the acid-based-gas supply system may be referred to as a Lewis acid gas supply system. In the case where the $BCl_3$ gas is used as the Lewis acid gas, the Lewis acid gas supply system may be referred to as a $BCl_3$ gas supply system. The $BCl_3$ gas supply system may be referred to as a $BCl_3$ supply system.

Furthermore, an inert gas supply system is mainly configured by the gas supply pipes 510, 520 and 530, the MFCs 512, 522 and 532, and the valves 514, 524 and 534. Since the inert gas acts as a purge gas, a dilution gas or a carrier gas, the inert gas supply system may be referred to as a purge gas supply system, a dilution gas supply system or a carrier gas supply system.

An exhaust pipe 231 configured to exhaust an internal atmosphere of the process chamber 201 is installed in the manifold 209. A pressure sensor 245 as a pressure detector (pressure detecting part) configured to detect an internal pressure of the process chamber 201, an APC (Auto Pressure Controller) valve 243 as a pressure controller (pressure control part) configured to control the internal pressure of the process chamber 201, and a vacuum pump 246 as a vacuum exhaust device are installed in the exhaust pipe 231 sequentially from the upstream side. The APC valve 243 is a valve configured to regulate the internal pressure of the process chamber 201 by opening or closing the APC valve 243 white operating the vacuum pump 246. An exhaust system, namely an exhaust line, is mainly configured by the exhaust pipe 231, the APC valve 243 and the pressure sensor 245. Furthermore, the vacuum pump 246 may be included in the exhaust system. Moreover, a trap device or a detoxifying device may be included in the exhaust system.

A seal cap 219 as a furnace lid capable of air-tightly closing a lower end opening of the manifold 209 is installed under the manifold 209. The seal cap 219 is configured to make contact with the lower end portion of the manifold 209 from the vertical lower side. The seal cap 219 is made of, for example, metal such as stainless steel or the like and is formed in a disc shape. An O-ring 220b as a seal member making contact with the lower end portion of the manifold 209 is installed on the upper surface of the seal cap 219. A rotating mechanism 267 configured to rotate the boat 217 to be described later is installed at the opposite side of the seal cap 219 from the process chamber 201. A rotary shaft 255 of the rotating mechanism 267 extends through the seal cap 219 and is connected to the boat 217. The rotating mechanism 267 is configured to rotate the wafers 200 by rotating the boat 217. The seal cap 219 is configured to be vertically moved up and down by a boat elevator 115 as an elevator mechanism vertically installed outside the reaction tube 203. The boat elevator 115 is configured to load and unload the boat 217 into and from the process chamber 201 by moving the seal cap 219 up and down. The boat elevator 115 configured as a transfer device (transfer mechanism) which transfers the boat 217, namely the wafers 200, into and out of the process chamber 201. Under the manifold 209, there is installed a shutter (not shown) as a furnace opening cover capable of air-tightly closing the lower end opening of the manifold 209 while the seal cap 219 is moved down by the boat elevator 115. The shutter is made of, for example, metal such as stainless steel or the like and is formed in a disc shape. An O-ring (not shown) as a seal member making contact with the lower end portion of the manifold 209 is installed on the upper surface of the shutter. The opening/closing operation (the elevating operation or the rotating operation) of the shutter is controlled by a shutter opening/closing mechanism (not shown).

The boat 217 as a substrate support is configured so as to support a plurality of, for example, 25 to 200, wafers 200 in a horizontal posture and in multiple stages by arranging the wafers 200 in the vertical direction with the centers thereof aligned with each other, namely so as to arrange the wafers 200 in a spaced-apart relationship. The boat 217 is made of, for example, a heat-resistant material such as quartz, SiC or the like. Under the boat 217, there is installed a heat insulating cylinder 218 as a cylindrical member made of, for example, a heat-resistant material such as quartz, SiC or the like. With this configuration, the heat generated from the heater 207 is hardly radiated to the seal cap 219. However, the present embodiment is not limited to the aforementioned configuration. For example, the heat insulating cylinder 218 may not be installed under the boat 217. Heat insulating plates made of a heat-resistant material such as quartz, SiC or the like may be installed so as to be supported in a horizontal posture and in multiple stages.

A temperature sensor 263 serving as a temperature detector is installed within the reaction tube 203. Based on temperature information defected by the temperature sensor 263, a state of supplying electric power to the heater 207 is adjusted such that the interior of the process chamber 201 has a desired temperature distribution. Similar to the nozzles 410, 420 and 430, the temperature sensor 263 is formed in an L-shape. The temperature sensor 263 is installed along the inner wall of the reaction tube 203.

Figure 3:
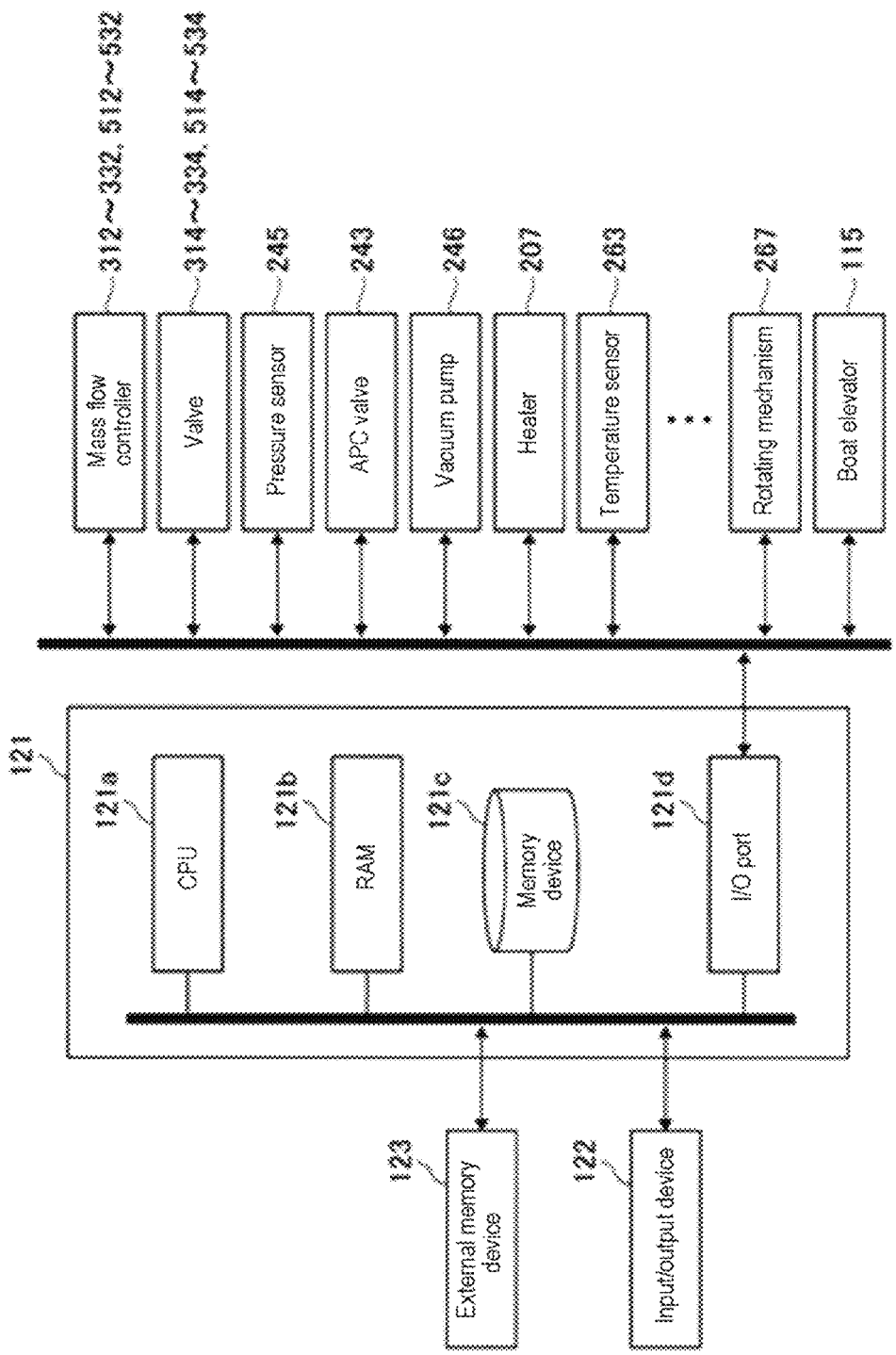
FIG. 3 is a block diagram illustrating the configuration of a controller of the substrate processing apparatus illustrated in FIG. 1.

As illustrated in FIG. 3, a controller 121, which is a control part (control means), may be configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a HDD (Hard Disk Drive), or the like. A control program for controlling operations of a substrate processing device or a process recipe, in which a sequence, condition, or the like for a film forming process (step) to be described later is written, is readably stored in the memory device 121c. The process recipe functions as a program designed to cause the controller 121 to execute each sequence in the film forming process which will be described later, so as to obtain a predetermined result. Hereinafter, the process recipe and the control program will be generally and simply referred to as a "program." Furthermore, the process recipe will be simply referred to as a "recipe". When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotating, mechanism 267, the boat elevator 115, and the like.

The CPU 121a is configured to read the control program from the memory device 121c and to execute the control program. The CPU 121a is also configured to read the recipe from the memory device 121c according to an input of an operation command or the like from the input/output device 122. The CPU 121a is configured to control, according to the recipe thus read, the flow rate adjusting operations of various kinds of gases performed by the MFCs 312, 322, 332, 512, 522 and 532, the opening closing operations of the valves 314, 324, 334, 514, 524 and 534, the opening/closing operation of the APC valve 243, the pressure regulating operation performed by the APC valve 243 based on the pressure sensor 245, the temperature adjusting operation performed by the heater 207 based on the temperature sensor 263, the start/stop of the vacuum pump 246, the operation of rotating the boat 217 with the rotating mechanism 267 and adjusting the rotation speed of the boat 217, the operation of moving the boat 217 up and down with the boat elevator 115, and the like.

The controller 121 may be configured by installing into a computer the aforementioned program stored in an external memory device 123 (for example, a magnetic tape, a magnetic disc such as a flexible disc or a hard disc, an optical disc such as a CD or a DVD, a magneto-optical disc such as an MO or the like, a semiconductor memory such as a USB memory or a memory card). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. In addition, the program may be provided to the computer using a communication means such as the Internet or a dedicated line without having to use the external memory device 123.

(2) Substrate Processing Process

Figure 4:
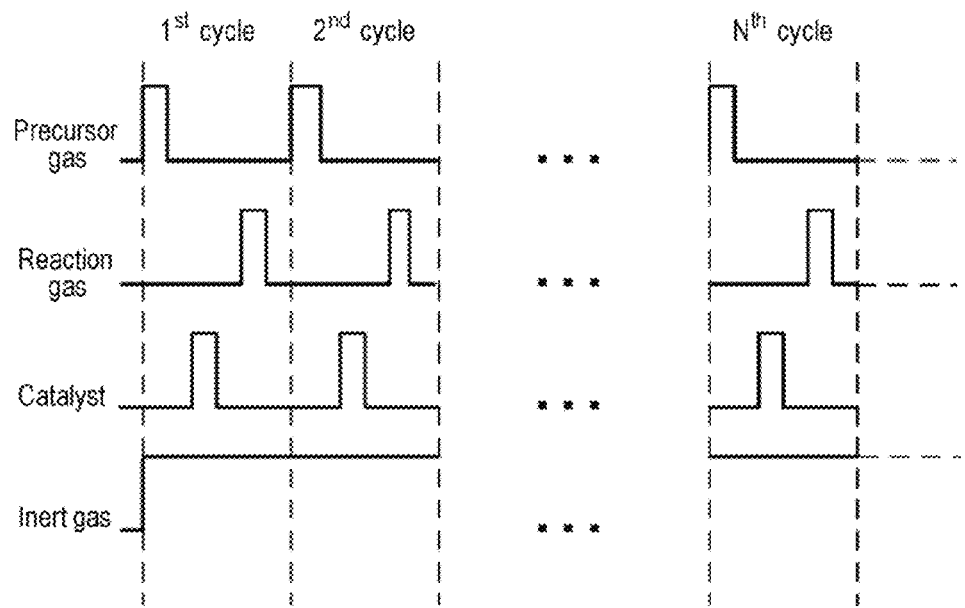
FIG. 4 is a view illustrating a time chart of a film forming sequence according to the first embodiment of the present disclosure.

A first embodiment of a process for forming, for example, a metal film constituting a gate electrode on a substrate, which is one process for manufacturing, a semiconductor device (apparatus), will now be described with reference to FIG. 4. The process for forming the metal film is implemented, using the processing furnace 202 of the substrate processing apparatus 10 described above. In the following descriptions, the operations of the respective parts constituting the substrate processing apparatus 10 are controlled by the controller 121.

A preferred film forming sequence (simply referred to as a sequence) of the present embodiment includes forming a film (e.g., a TiN film) on a wafer 200 by time-divisionally and sequentially performing: (a) supplying a precursor gas (e.g., a TDEAT gas) to the wafer 200 and causing precursor molecules (DTEAT molecules), which are contained in the precursor gas and which contains a main element (e.g., Ti) and ligands, to be adsorbed onto the wafer 200; (b) supplying a compound (e.g., a $BCl_3$ gas) containing an electron withdrawing group to the wafer 200 onto which the precursor molecules are adsorbed, and causing the compound-containing the electron withdrawing group to be adsorbed to the ligands contained in the precursor molecules; and (c) supplying a reaction gas (e.g., an $NH_3$ gas) to the wafer 200 onto which the precursor molecules and the compound containing the election withdrawing group are adsorbed, causing the ligands and the compound containing the electron withdrawing group to be desorbed from the wafer 200, and causing the main element contained in the precursor molecules to react with the reaction gas.

In the present disclosure, for the sake of convenience, the sequence illustrated in FIG. 4 may be denoted as follows. The same denotation will be used in describing the following modifications and other embodiments. P/V indicates a residual gas removal step which will be described later.

[TDEAT→P/V→BCl$_3$→P/V→NH$_3$→P/V]×n ⇒TiN

By the expression "performs a process (also referred to as a cycle, a step or the like) a predetermined number of times" used herein, it is meant that the process is performed once or multiple times. That is to say, it is meant that the process is performed once or more. FIG. 4 illustrates an example in which the respective processes (cycles) are repeated by N cycles. The number of performing the respective processes is appropriately selected depending on a film thickness required in the finally-formed TiN film. That is to say, the number of performing the respective processes described above is determined according to a target film thickness.

By the expression "time-divisionally" used herein, it is meant that a period is divided (separated) in terms of time. For example, by the expression "time-divisionally performs the respective processes", it is meant that the respective processes are performed non-synchronously, namely without synchronization. In other words, it is meant that the respective processes are performed intermittently (pulsewise). That is to say, it is meant that the process gases supplied in the respective processes are supplied so as not to be mixed with each other. In the case of time-divisionally performing the respective processes multiple times, the process gases supplied in the respective processes are alternately supplied so as not to be mixed with each other.

As used herein, the term "wafer" may refer to "a wafer itself" or "a laminated body (an assembly) of a wafer and a predetermined layer, film, or the like formed on a surface of the wafer". That is to say, a wafer including a predetermined layer, film, or the like formed on its surface may be referred to as a wafer. In addition, as used herein, the phrase "a surface of a wafer" may refer to "a surface (exposed surface) of a wafer itself" or "a surface of a predetermined layer, film, or the like formed on a wafer, namely an uppermost surface of a wafer as a laminated body."

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" used herein may be synonymous with the term "wafer."

As used herein, the term "metal film" refers to a film composed of a conductive material including metal atoms (also simply referred to as a conductive film). The metal film includes a conductive metal nitride film (a metal nitride film), a conductive metal oxide film (a metal oxide film), a conductive metal oxynitride film (a metal oxynitride film), a conductive metal oxycarbide film (a metal oxycarbide film), a conductive metal composite film, a conductive metal alloy film, a conductive metal silicide film (a metal silicide film), a conductive metal carbide film (a metal carbide film), a conductive metal carbonitride film (a metal carbonitride film), and so forth. The TiN film (titanium nitride film) is a conductive metal nitride film.

As used herein, the term "catalyst" refers to a substance substantially acting as a catalyst, which mostly remains not decomposed even when a portion of the molecular structure thereof is decomposed in the course of a chemical reaction and which changes a reaction speed.

(Wafer Preparation Step)

If a plurality of wafers 200 is charged to the boat 217 (in a wafer charging operation), the shutter is moved by the shutter opening/closing mechanism to open the lower end opening of the manifold 209 (in a shutter opening operation). Thereafter, as illustrated in FIG. 1, the boat 217 charged with the plurality of wafers 200 is lifted up by the boat elevator 115 and is loaded into the process chamber 201 (in a boat loading operation). In this state, the seal cap 219 closes the lower end of the manifold 209 through the O-ring 220b.

(Pressure Regulation and Temperature Adjustment Step)

The interior of the process chamber 201, namely the space in which the wafers 200 exist, is evacuated (depressurized) by the vacuum pump 246 so as to reach a desired pressure (desired vacuum level). At this time, the internal pressure of the process chamber 201 is measured by the pressure sensor 245. The APC valve 243 is feedback-controlled based on the measured pressure information. The vacuum pump 246 is continuously operated at least until the film forming process to be described later is completed. The wafers 200 in the process chamber 201 are heated by the heater 207 to a desired film forming temperature. At this time, the supply condition of electric power supplied to the heater 207 is feedback-controlled based on the temperature information detected by the temperature sensor 263 such that the interior of the process chamber 201 has a desired temperature distribution. The heating of the interior of the process chamber 201 by the heater 207 may be continuously performed at least until the film forming process to be described later is completed. The rotation of the boat 217 and the waters 200 by the rotating mechanism 267 is started. The rotation of the boat 217 and the wafers 200 by the rotating mechanism 207 may be continuously performed at least until the film forming process to be described later is completed.

(TiN Film Forming Step)

Subsequently, a first embodiment of forming a TiN film as a metal-containing film illustrated in FIG. 4 will be described. The TiN film forming step includes a TDEAT gas supply step, a residual gas removal step, a BCl$_3$ gas supply step, a residual gas removal step, an NH$_3$ gas supply step and a residual gas removal step, which will be described below.

(TDEAT Gas Supply Step)

The valve 314 is opened to allow a TDEAT gas as a precursor gas to flow through the gas supply pipe 310. A flow rate of the TDEAT gas flowing through the gas supply pipe 310 is adjusted by the MFC 312. The TDEAT gas is supplied from the gas supply hole 410a of the nozzle 410 into the process chamber 201 and is exhausted from the exhaust pipe 231.

At this time, the TDEAT gas is supplied to the wafers 200. That is to say, the surfaces of the wafers 200 are exposed to the TDEAT gas. Simultaneously, the valve 514 is opened to allow a N$_2$ gas to flow through the carrier gas supply pipe 510. A flow rate of the N$_2$ gas flowing through the carrier gas supply pipe 510 is adjusted by the MFC 512. The N$_2$ gas is supplied into the process chamber 201 together with the TDEAT gas and is exhausted from the exhaust pipe 231. At this time, in order to prevent entry of the TDEAT gas into the nozzles 420 and 430, the valves 524 and 534 are opened to allow the N$_2$ gas to flow through the carrier gas supply pipes 520 and 530. The N$_2$ gas is supplied into the process chamber 201 via the gas supply pipes 320 and 330 and the nozzles 420 and 430 and is exhausted from the exhaust pipe 231.

At this time, the APC valve 243 is appropriately adjusted to set the internal pressure of the process chamber 201 at, for example, a (predetermined) pressure which falls within a range of 1 to 1,000 Pa, specific-ally a (predetermined) pressure which falls within a range of 1 to 500 Pa, more specifically a (predetermined) pressure which falls within a range of 50 to 100 Pa. If the internal pressure of the process chamber 201 is higher than 1,000 Pa, there is a possibility that the residual gas removal to be described later is not sufficiently performed and the byproduct is introduced into the film, thereby increasing tire resistivity of the film. If the internal pressure of the process chamber 201 is lower than 1 Pa, there is a possibility that the reaction speed of the TDEAT gas is not sufficiently obtained (namely; a predetermined deposition rate is not obtained). In the present disclosure, when a numerical value range is described to read, for example, "1 to 1,000 Pa", it means 1 Pa or more and 1,000 Pa or less. That is to say, 1 Pa and 1,000 Pa are included in the numerical value range. This holds true with respect to all the numerical values other than the pressure described in the present disclosure, such as a flow rate, a time, a temperature and the like.

The supply flow rate of the TDEAT gas controlled by the MFC 312 is set at, for example, a (predetermined) flow rate which falls within a range of 0.001 to 3 slm, specifically a (predetermined) flow rate which falls within a range of 0.001 to 1 slm, more specifically a (predetermined) flow rate which falls within a range of 0.010 to 0.0020 slm. If the supply flow rate of the TDEAT gas is higher than 3 slm, there is a possibility that an impurity such as C or the like is introduced into the film and the resistivity of the film is increased. If the supply flow rate of the TDEAT gas is lower than 0.001 slm, there is a possibility that the reaction speed of the TDEAT gas is not sufficiently obtained (namely, a predetermined deposition rate is not obtained).

The supply flow rate of the $N_2$ gas controlled by the MFCs 512, 522 and 532 is set at, for example, a (predetermined) flow rate which falls within a range of 0.2 to 20 slm, specifically a (predetermined) flow rate which falls within a range of 0.4 to 15 slm, more specifically a (predetermined) flow rate which fells within a range of 0.40 to 0.50 slm. If the supply flow rate of the $N_2$ gas is higher than 20 slm, there is a possibility that the reaction speed of the TDEAT gas is not sufficiently obtained (namely, a predetermined deposition rate is not obtained). If the supply flow rate of the $N_2$ gas is lower than 0.2 slm, there is a possibility that an impurity such as C or the like is introduced into the film and the resistivity of the film is increased.

The time period during which the TDEAT gas is supplied to the wafers 200, namely the gas supply time period (irradiation time period), is set at, for example, a (predetermined) time period which falls within a range of 0.2 to 60 seconds, specifically a (predetermined) time period which falls within a range of 0.5 to 30 seconds, more specifically a (predetermined) time period which falls within a range of 10 to 15 seconds. If the gas supply time period is longer than 60 seconds, there is a possibility that an impurity such as C or the like is introduced into the film and the resistivity of the film is increased. If the gas supply time period is shorter than 0.2 second, there is a possibility that the reaction speed of the TDEAT gas is not sufficiently obtained (namely, a predetermined deposition rate is not obtained).

At this time, the temperature of the heater 207 is set such that the temperature of the wafers 200 is, for example, a (predetermined) temperature which falls within a range of 200 to 500 degrees C., specifically a (predetermined) temperature which falls within a range of 250 to 400 degrees C., more specifically a (predetermined) temperature which falls within a range of 280 to 320 degrees C. If the temperature of the wafers 200 is higher than 500 degrees C., the pyrolysis of the TDEAT gas may be accelerated. Thus, there is a possibility that (1) the deposition rate becomes too high and the controllability and uniformity of the Him thickness deteriorates. Furthermore, there is a possibility that (2) a large amount of impurity originating from the pyrolized TDEAT gas is introduced into the film and the resistivity of the film is increased. If the temperature of the wafers 200 is lower than 200 degrees C., there is a possibility that the reactivity of the TDEAT gas becomes low and the object of removing ligands is not achievable and further that a large amount of ligands remain in the film and the resistivity of the film Is increased. At this time, only the TDEAT gas and the $N_2$ gas are supplied into the process chamber 201. By supplying the TDEAT gas, the TDEAT gas is absorbed onto the uppermost surfaces of the wafers 200 (the base films formed on the surfaces of the wafers 200). Thus, a TDEAT-containing layer is formed.

The TDEAT-containing layer includes not only a continuous adsorption layer formed of TDEAT molecules but also a discontinuous adsorption layer. That is to say, the TDEAT-containing layer includes an adsorption layer having a thickness of one molecular layer or less than one molecular layer, which is composed of TDEAT molecules (including an intermediate by-product of TDEAT molecules (also referred to as an intermediate body)). The TDEAT-containing layer may be referred to as a Ti-containing layer.

(Residual Gas Removal Step)

After the TDEAT-containing layer is formed on the uppermost surface of each of the waters 200 (the base film of the surface), the valve 314 is closed to stop the supply of the TDEAT gas. At this time, the interior of the process chamber 201 is evacuated by the vacuum pump 246 while opening the APC valve 243. Thus, the TDEAT gas remaining within the process chamber 201, which has not reacted or which has contributed to the formation of the TDEAT-containing layer, is removed from the interior of the process chamber 201. That is to say, the TDEAT gas remaining in the space where the wafers 200 on which TDEAT is adsorbed exist, is removed. At this time, the supply of the $N_2$ gas info the process chamber 201 is maintained while opening the valves 514, 524 and 534. The $N_2$ gas acts as a purge gas and can enhance the effect of removing the TDEAT gas remaining within the process chamber 201, which has not reacted or which has contributed to the formation of the TDEAT-containing layer, from the interior of the process chamber 201.

At this time, the gas remaining within the process chamber 201 may not be completely removed and the interior of the process chamber 201 may not be completely purged. If the gas remaining within the process chamber 201 is small in amount, no adverse effect is generated at a subsequent step. The flow rate of the $N_2$ gas supplied into the process chamber 201 need not be made large. For example, by supplying the $N_2$ gas in an amount substantially equal to the volume of the reaction tube 203 (the process chamber 201), it is possible to perform purging to such an extern that no adverse effect is generated at the subsequent step. By not completely purging the interior of the process chamber 201 in this way, if is possible to shorten the purging time and to improve the throughput. It is also possible to suppress the consumption of the $N_2$ gas to a necessary minimum level.

(BCl$_3$ Gas Supply Step)

After removing the residual gas remaining within the process chamber 201 the valve 334 is opened to allow the BCl$_3$ gas to flow through the gas supply pipe 330. A flow rate of the BCl$_3$ gas flowing through the gas supply pipe 330 is adjusted by the MFC 332. The BCl$_3$ gas is supplied from the gas supply hole 430a of the nozzle 430 into the process chamber 201 and is exhausted from the exhaust pipe 231.

At this time, the BCl$_3$ gas is supplied to the wafers 200. That is to say, the surfaces of the wafers 200 are exposed, to the BCl$_3$ gas. Simultaneously, the valve 534 is opened to allow a N$_2$ gas to flow through the carrier gas supply pipe 530. A flow rate of the N$_2$ gas flowing through the carrier gas supply pipe 530 is adjusted by the MFC 532. The N$_2$ gas is supplied into the process chamber 201 together with the BCl$_3$ gas and is exhausted from the exhaust pipe 231. At this time, in order to prevent entry of the BCl$_3$ gas into the nozzles 410 and 420, the valves 514 and 524 are opened to allow the N$_2$ gas to flow through the carrier gas supply pipes 510 and 520. The N$_2$ gas is supplied into the process chamber 201 via the gas supply pipes 310 and 320 and the nozzles 410 and 420 and is exhausted from the exhaust pipe 231.

By appropriately adjusting the APC valve 243, the internal pressure of the process chamber 201 is set at, for example, a (predetermined) pressure which falls within a range of 0.01 to 70,000 Pa, specifically a (predetermined) pressure which falls within a range of 0.01 to 100 Pa, more specifically a (predetermined) pressure which falls within a range of 0.01 to 0.1 Pa. If the internal pressure of the process chamber 201 is higher than 70,000 Pa, the BCl$_3$ gas is excessively adsorbed onto the wafers 200 (namely, the BCl$_3$ gas is adsorbed onto a region other than the TDEAT-containing layer adsorbed onto each of the wafers 200). Thus, there may be a case where the BCl$_3$ gas remains in the film. If the internal pressure of the process chamber 201 is lower than 0.01 Pa, there may be a case where the BCl$_3$ gas is not sufficiently adsorbed onto the wafers 200.

The supply flow rate of the BCl$_3$ gas controlled by the MFC 332 is set at, for example, a (predetermined) flow rate which falls within a range of 0.1 to 20 slm, specifically a (predetermined) flow rate which falls within a range of 0.1 to 3 slm, more specifically a (predetermined) flow rate which falls within a range of 0.3 to 0.7 slm. If the supply flow rate of the BCl$_3$ gas is higher than 20 slm, the BCl$_3$ gas is excessively adsorbed and remains in the film. Thus, there may be a case where the resistance value of the film is increased. If the supply flow rate of the BCl$_3$ gas is lower than 0.1 slm, there may be a case where the BCl$_3$ gas is not sufficiently adsorbed onto the wafers 200.

The supply flow rate of the N$_2$ gas controlled by the MFCs 512, 522 and 532 is set at, for example, a (predetermined) flow rate which falls within a range of 0.2 to 20 slm, specifically a (predetermined) flow rate which falls within a range of 0.4 to 15 slm, more specifically a (predetermined) flow rate which falls within a range of 1 to 2 slm. As the supply flow rate of the N$_2$ gas grows higher, it is easier to obtain an action of removing an extra BCl$_3$ gas. However, if the supply flow rate of the N$_2$ gas is higher than 20 slm, there may be a case where the BCl$_3$ gas is not sufficiently adsorbed onto the wafers 200. If the supply flow rate of the N$_2$ gas is lower than 0.2 slm, there may be a case where an extra BCl$_3$ gas remains in the film and the resistance value of the film is increased.

The time period during which the BCl$_3$ gas is supplied to the wafers 200, namely the gas supply time period (irradiation time period is set at, for example, a (predetermined) time period which falls within a range of 0.001 to 300 seconds, specifically a (predetermined) time period which falls within a range of 0.4 to 15 seconds, more specifically a (predetermined) time period which falls within a range of 1 to 3 seconds. If the gas supply time period is longer than 300 seconds, there may be a case where the BCl$_3$ gas is excessively adsorbed and remains in the film, thereby increasing the resistance value of the film. If the gas supply time period is shorter than 0.001 second, there may be a case where the BCl$_3$ gas is not sufficiently adsorbed onto the wafers 200. At this time, the temperature of the heater 207 is set at the same temperature as the temperature used at the TDEAT gas supply step.

At this time, only the BCl$_3$ gas and the gas are supplied into the process chamber 201. By supplying the BCl$_3$ gas, the BCl$_3$ gas (including an intermediate by-product of the BCl$_3$ gas (also referred to as an intermediate body)) is mainly absorbed onto (bonded to) the ligands (—N(C$_2$H$_5$)$_2$ and intermediate bodies of —N(C$_2$H$_5$)$_2$) of the TDEAT molecules contained in the TDEAT-containing layer adsorbed onto the uppermost surface of each of the wafers 200 (the base films of the surfaces).

(Residual Gas Removal Step)

After the BCl$_3$ gas is adsorbed onto the TDEAT-containing layer the valve 334 is closed to stop the supply of the BCl$_3$ gas. At this time, the interior of the process chamber 201 is evacuated by the vacuum pump 246 while opening the APC valve 243. Thus, the BCl$_3$ gas remaining within the process chamber 201, which has not reacted or which has not been adsorbed onto the TDEAT-containing layer, is removed from the interior of the process chamber 201. That is to say, the BCl$_3$ gas remaining in the space where the wafers 200 having the TDEAT-containing layers onto which the BCl$_3$ gas are adsorbed exist, which has not reacted or which has not been adsorbed onto the TDEAT-containing layer, is removed. At this time, the supply of the N$_2$ gas into the process chamber 201 is maintained while opening the valves 514, 524 and 534. The N$_2$ gas acts as a purge gas and can enhance the effect of removing the BCl$_3$ gas remaining within the process chamber 201, which has not reacted or which has not been adsorbed onto the TDEAT-containing layer from the interior of the process chamber 201.

At this time, similar to the residual gas removal step performed after the TDEAT gas supply step, the gas remaining within the process chamber 201 may not be completely removed and the interior of the process chamber 201 may not be completely purged.

(NH$_3$ Gas Supply Step)

After the gas remaining within the process chamber 201 is removed, the valve 324 is opened to allow an NH$_3$ gas to flow through the gas supply pipe 320. A flow rate of the NH$_3$ gas flowing through the gas supply pipe 320 is adjusted by the MFC 322. The NH$_3$ gas is supplied from the gas supply hole 420a of the nozzle 420 into the process chamber 201 and is exhausted front the exhaust pipe 231. At this time, the NH$_3$ gas is supplied to the wafers 200. That is to say, the surfaces of the wafers 200 are exposed to the NH$_3$ gas. Simultaneously, the valve 524 is opened to allow a N$_2$ gas to flow through the carrier gas supply pipe 520. A flow rate of the N$_2$ gas flowing through the carrier gas supply pipe 520 is adjusted by the MFC 522. The N$_2$ gas is supplied into the process chamber 201 together with the NH$_3$ gas and is exhausted from the exhaust pipe 231. At this time, in order to prevent entry of the NH$_3$ gas into the nozzles 410 and 430, the vales 514 and 534 are opened to allow the N$_2$ gas to flow through the carrier gas supply pipes 510 and 530. The N$_2$ gas is supplied into the process chamber 201 via the gas supply pipes 310 and 330 and the nozzles 410 and 430 and is exhausted from the exhaust pipe 231.

When supplying the $NH_3$ gas, the APC valve 243 is appropriately adjusted to set the internal pressure of the process chamber 201 at, for example, a (predetermined) pressure which fails within a range of 1 to 70,000 Pa, specifically a (predetermined) pressure which falls within a range of 1 to 700 Pa, more specifically a (predetermined) pressure which falls within a range of 50 to 70 Pa. If the internal pressure of the process chamber 201 is higher than 70,000 Pa, there may be a case where the residual gas removal to be described later is not sufficiently performed. If the internal pressure of the process chamber 201 is lower than 1 Pa, there is a possibility that a sufficient deposition, rate is not achievable.

The supply flow rate of the $NH_3$ gas controlled by the MFC 322 is set at, for example, a (predetermined) flow rate which falls within a range of 0.1 to 20 slm, specifically a (predetermined) flow rate which falls within a range of 0.3 to 10 slm, more specifically a (predetermined) flow rate which falls within a range of 0.8 to 1.2 slm. As the supply flow rate of the $NH_3$ gas grows higher, it is easier to reduce the impurity introduced into the film and to reduce the resistance of the film. However, if the supply flow rate of the $NH_3$ gas is higher than 20 slm, there may be a case where the residual gas removal to be described later is not sufficiently performed. If the supply flow rate of the $NH_3$ gas is lower than 0.1 slm, the $NH_3$ gas cannot sufficiently react with the TDEAT-containing layer. Thus, there is a possibility that the ligands of TDEAT molecules containing C or the like remain in the film as an imparity and the resistivity of the film is increased.

The supply flow rate of the $N_2$ gas controlled by each of the MFCs 512, 522 and 532 is set at, for example, a (predetermined) flow rate which falls within a range of 0.2 to 20 slm, specifically a (predetermined) flow rate which falls within a range of 0.5 to 15 slm, more specifically a (predetermined) flow rate which falls within a range of 1 to 1.5 slm. If the supply flow rate of the $N_2$ gas is higher than 20 slm, there is a possibility that the concentration of the $NH_3$ gas is reduced and a sufficient deposition rate is not achievable. If the supply flow rate of the $N_2$ gas is lower than 0.2 slm, the $NH_3$ gas cannot sufficiently react with the TDEAT-containing layer. Thus, there is a possibility that the ligands of the TDEAT molecules containing C or the like remain in the film as an impurity and the resistivity of the film is increased.

The time period during which the $NH_3$ gas is supplied to the waters 200, namely the gas supply time period (irradiation time period), is set at, for example, a (predetermined) time period which falls within a range of 0.001 to 300 seconds, specifically a (predetermined) time period which falls within a range of 0.005 to 60 seconds, more specifically a (predetermined) time period which falls within a range of 15 to 25 seconds. As the gas supply time period grows longer, it is easier to reduce the amount of the impurity introduced into the film. However, if the gas supply time period Is longer than 300 seconds, there is a possibility that the residual gas removal to be described later is not sufficiently performed. If the gas supply time period is shorter than 0.001 seconds, there is a possibility that the ligands of the TDEAT molecules are left and introduced into the film to become an impurity. At this time, the temperature of the heater 207 is set at the same temperature as the temperature used at the TDEAT gas supply step and the $BCl_3$ gas supply step.

At this time, only the $NH_3$ gas and the $N_2$ gas are supplied into the process chamber 201. The $NH_3$ gas mainly reacts with the TDEAT molecules contained in the TDEAT-containing layer in which the $BCl_3$ gas (including an intermediate by-product of the $BCl_3$ gas) is adsorbed (bonded) to the ligands. Thus, the ligands are removed (extracted or desorbed) from the TDEAT molecules. N is bonded to a Ti atom having a dangling bond. Since the $BCl_3$ gas is adsorbed to the ligands of the TDEAT molecules, the bond between Ti as a main element and the ligands is weakened and the ligands are easily removable. At this time, the ligands removed from the TDEAT molecules due to the adsorption of the $BCl_3$ gas are bonded to hydrogen (H) contained in the $NH_3$ gas. The ligands are separated from the TDEAT-containing layer as a reaction by-product (also referred to as a by-product or an impurity) such as HCl (hydrogen chloride) as a chloride, $NH_4Cl$ (ammonium chloride), ethylamine ($HN(C_2H_5)_2$) or the like. Thus, a film containing Ti and N (hereinafter simply referred to as a TiN layer) is formed on each of the wafers 200. In addition, the $NH_3$ gas reacts with not only the TDEAT-containing layer onto which the $BCl_3$ gas is adsorbed, but also the TDEAT-containing layer onto which the $BCl_3$ gas is not adsorbed or the Ti-containing layer from which the ligands are removed, thereby forming a TiN layer on each of the wafers 200.

(Residual Gas Removal Step)

After the TiN layer is formed, the valve 324 is closed to stop the supply of the $NH_3$ gas. At this time, the interior of the process chamber 201 is evacuated by the vacuum pump 246 while opening the APC valve 243. Thus, the $NH_3$ gas remaining within the process chamber 201, which has not reacted or which has contributed to the formation of the TiN layer, or the byproduct remaining within the process chamber 201, is removed from the interior of the process chamber 201. That is to say, the $NH_3$ gas remaining in the space where the wafers 200 having the TiN layers exist, which has not reacted or which has contributed to the formation of the TiN layer, or the byproduct remaining in the space, is removed. At this time, the supply of the $N_2$ gas into the process chamber 201 is maintained while opening the valves 514, 524 and 534. The $N_2$ gas acts as a purge gas and, therefore, can enhance the effect of removing the $NH_3$ gas remaining within the process chamber 201, which has not reacted or which has contributed to the formation of the TiN layer or the byproduct remaining within the process chamber 201, from the interior of the process chamber 201.

At this time, similar to the residual gas removal step performed after the TDEAT gas supply step, the gas remaining within the process chamber 201 may not be completely removed and the interior of the process chamber 201 may not be completely purged.

(Performing Cycle a Predetermined Number of Times)

A TiN film having a predetermined thickness (e.g., a thickness of 0.1 to 10 nm) is formed on each of the wafers 200 by performing, by n cycle (where n is an integer of one or more), one cycle sequentially and time-divisionally (non-simultaneously, i.e., without synchronization) performing the TDEAT gas supply step, the residual, gas removal step, the $BCl_3$ gas supply step, the residual gas removal step, the $NH_3$ gas supply step and the residual gas removal step. The aforementioned cycle may be repeated multiple times.

(After-Purge Step and Atmospheric Pressure Return Step)

After forming the TiN film having a predetermined film thickness, the $N_2$ gas is supplied from the gas supply pipes 510, 520 and 530 into the process chamber 201 and is exhausted from the exhaust pipe 231. The $N_2$ gas acts as a purge gas. Thus, the interior of the process chamber 201 is purged by an inert gas. The gases or the reaction byproducts remaining within the process chamber 201 are removed from the interior of the process chamber 201 (in an after-purging operation). Thereafter, the internal atmosphere of the process chamber 201 is substituted with an inert gas (in an inert gas substituting operation), and the internal pressure of the process chamber 201 is returned to atmospheric pressure (in an atmospheric pressure returning operation).

(Unloading Step)

Thereafter, the seal cap 219 is moved down by the boat elevator 115 to open the lower end of the manifold 209. The processed wafers 200 supported by the boat 217 are unloaded from the lower end of the manifold 209 to the outside of the reaction tube 203 (in a boat unloading operation). After unloading the boat 217, the shutter (not shown) is moved so that the lower end opening of the manifold 209 is sealed by the shutter (not shown) though the O-ring 220c (in a shutter closing operation). The processed wafers 200 are unloaded to the outside of the reaction tube 203 and then discharged from the boat 217 (in a wafer discharging operation).

(3) Effects According to the Present Embodiment

According to the present embodiment, one or more effects mentioned below may be achieved.

(A) The precursor gas is supplied to the substrate. The precursor molecules, which are contained in the precursor gas and which contain a main element and ligands, are adsorbed onto the substrate. By supplying a compound having an electron, withdrawing group to the substrate in a state in which the precursor molecules are adsorbed onto the substrate, it is possible to weaken the bonding force between the main element and the ligands of the precursor molecules and to allow the ligands to be easily removed from the main element. Thereafter, the reaction gas is supplied to the substrate onto which the precursor molecules and the compound having an electron withdrawing group are adsorbed, whereby the ligands and the compound having an electron withdrawing group are desorbed from the substrate. It is therefore possible to improve the ligand removal efficiency and to restrain the ligands from remaining in the film as an impurity. In addition, the main element and the reaction gas can be caused to react with each other. It is therefore possible to form a high-quality film. For example, in the present embodiment described above, the TDEAT gas as the precursor gas is supplied to the substrate. The TDEAT molecules, which are contained in the TDEAT gas and which contain Ti as a main element and —$N(C_2H_5)_2$ as ligands (which also contain an intermediate body of —$N(C_2H_5)_2$), are adsorbed onto the substrate. By supplying the $BCl_3$ gas (including an intermediate body of $BCl_3$) as a compound basing an electron withdrawing group to the substrate in a state in which the TDEAT molecules are adsorbed onto the substrate, it is possible to weaken the bonding force between Ti and —$N(C_2H_5)_2$ of the TDEAT molecules and to allow —$N(C_2H_5)_2$ to be easily removed from Ti. Thereafter, the $NH_3$ gas as the reaction gas is supplied to the substrate onto which the TDEAT molecules and $BCl_3$ are adsorbed, whereby —$N(C_2H_5)_2$ and $BCl_3$ are desorbed from the substrate. It is therefore possible to improve the removal efficiency of —$N(C_2H_5)_2$ and to restrain —$N(C_2H_5)_2$ from remaining in the TiN film as an impurity. In addition, Ti and the $NH_3$ gas can be caused to react with each other. It is therefore possible to form a high-quality film while suppressing an increase in the resistivity of the TiN film.

(B) By time-divisionally supplying the precursor gas and the compound having an electron withdrawing group as a catalyst (namely, by performing the residual gas removal step between the precursor gas supply step and the catalyst supply step), it is possible to restrain the compound having an electron withdrawing group from directly applying a catalytic action with respect to the precursor gas. It is therefore possible to restrain the main element of the precursor gas from being adsorbed onto the substrate in a state in which the precursor gas is decomposed by the compound having an electron withdrawing group and the ligands are removed. In addition, it is possible to restrain the removed ligands from being introduced into the film as an impurity.

(C) By time-divisionally supplying the precursor gas and the compound having an electron withdrawing group as a catalyst (namely, by performing the residual gas removal step between the precursor gas supply step and the catalyst supply step), it is possible to restrain the compound having an electron withdrawing group from directly applying a catalytic action with respect to the precursor gas. It is therefore possible to restrain the ligands removed from the precursor gas and the compound having an electron withdrawing group from being bonded to each other and to restrain a resultant reaction byproduct from re-adhering to the substrate (namely, it is possible to reduce a adsorption constraint for the surface of the substrate).

(D) By supplying the reaction gas to the substrate onto which the precursor molecules and the compound having an electron withdrawing group supplied as the catalyst are adsorbed, it is possible to desorb the ligands and the compound having an electron withdrawing group from the substrate and to cause the main element contained in the precursor molecules and the reaction gas to react with each other. It is therefore possible to form a high-quality film having a smaller amount of an impurity and a reaction byproduct. In addition, by time-divisionally supplying the reaction gas and the compound having an electron withdrawing group supplied as the catalyst, it is possible to restrain the reaction byproduct and the reaction gas from reacting with each other. Thus, the supplied reaction gas can be efficiently used in the film forming process.

(E) By using the compound having an electron withdrawing group as the catalyst, it is possible to reduce the electron density of atoms that constitute the ligands, and to increase the dissociation constant, thereby weakening the bond force between the main element and the ligands. Thus, the ligands are easily removable when, the reaction gas is supplied. It is therefore possible to restrain the ligands from being introduced into the film as an impurity. In addition, by using a Lewis acid (Lewis acid gas), which is an acid-based gas, as the compound having an electron withdrawing group, it is possible to receive (or remove) the unpaired electrons of atoms that constitute the ligands. This makes it possible to further weaken the bond force between the main element and the ligands.

Second Embodiment of the Present Disclosure

Figure 5:
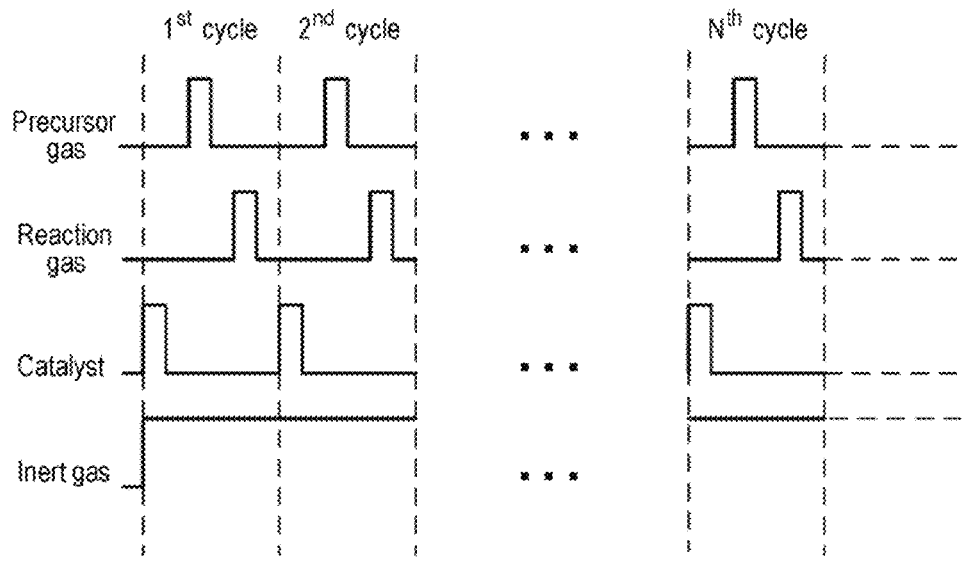
FIG. 5 is a view illustrating a time chart of a film forming sequence according to a second embodiment of the present disclosure.

As for a second embodiment, points differing from those of the first embodiment will be described below while omitting detailed descriptions on the same points as those of the first embodiment. In the first embodiment, there has been described an example in which the TiN film is formed by sequentially and time-divisionally (non-simultaneously, intermittently pulse-wise) performing the TDEAT gas supply step, the residual gas removal step, the $BCl_3$ gas supply step, the residual gas removal step, the $NH_3$ gas supply step and the residual gas removal step. This embodiment differs from the first embodiment in that, as illustrated in FIG. 5 and as will be described below, when forming the TiN film, a BCl₃ gas supply step and a residual gas removal step are performed prior to a TDEAT gas supply step. That is to say, in the second embodiment, a cycle including a BCl₃ gas supply step, a residual gas removal step, a TDEAT gas supply step, a residual gas removal step, a BCl₃ gas supply step, a residual gas removal step, an NH₃ gas supply step and a residual gas removal step is sequentially and time-divisionally performed n times (where n is an integer of one or more). Processing procedures and processing conditions in the respective steps are substantially the same as those of the first embodiment.

[BCl₃→P/V→TDEAT→P/V→BCl₃→P/V→NH₃→P/V]×n ⇒ TiN

According to the present embodiment, it is possible to achieve effects similar to those of the first embodiment. In addition, according to the present embodiment, in the second and subsequent cycles, the catalyst is supplied after the TiN film is formed by supplying the reaction gas. Thus, it is possible to achieve an effect in that, if the reaction byproduct formed at the time of supplying the reaction gas remains on the substrate, the catalyst reacts with the reaction byproduct, thereby removing the reaction byproduct from the substrate.

Modification 1 of the Second Embodiment

In the aforementioned second embodiment, there has been described an example in which the BCl₃ gas as one kind of compound having an electron withdrawing group is used as the catalyst and in which when forming the TiN film, a cycle including the catalyst (BCl₃ gas) supply step, the residual gas removal step, the TDEAT gas supply step, the residual gas removal step, the catalyst (BCl₃ gas) supply step, the residual gas removal step, the NH₃ gas supply step and the residual gas removal step is sequentially and time-divisionally performed n times (where n is an integer of one or more). In modification 1, there will be described an example in which when performing the aforementioned cycle twice or more, two kinds of catalysts are selectively used depending on the used timing and the purpose. That is to say, when forming the TiN film, a cycle including a first catalyst supply step, a residual gas removal step, a TDEAT gas supply step, a residual gas removal step, a second catalyst supply step, a residual gas removal step, an NH₃ gas supply step and a residual gas removal step is sequentially and time-divisionally performed twice or more.

As the first catalyst, it may be possible to use a compound having an electron donating group, specifically a salt-based gas, more specifically a Lewis base, for example, pyridine (C₅H₅N) as described below. By using the compound having an electron donating group, in the second cycle, the byproduct formed at the NH₃ gas supply step of the first cycle and remaining in the TiN layer formed on each of the wafers 200 reacts with (is bonded to) the compound having an electron donating group. It is therefore possible to desorb the byproduct from the TiN layer formed on each of the wafers 200. Similar to the aforementioned second embodiment, the BCl₃ gas may be used as the second catalyst. According to this modification, it may be possible to achieve effects similar to those of the second embodiment. Furthermore, according to this modification, when performing the aforementioned cycle twice or more, two kinds of catalysts are selectively used depending on the used timing and the purpose. It is therefore possible to achieve an effect of efficiently desorbing the byproduct from the TiN layer formed on each of the wafers 200.

[C₅H₅N→P/V→TDEAT→P/V→BCl₃→P/V→NH₃→P/V]×n ⇒ TiN

Third Embodiment of the Present Disclosure

Figure 6:
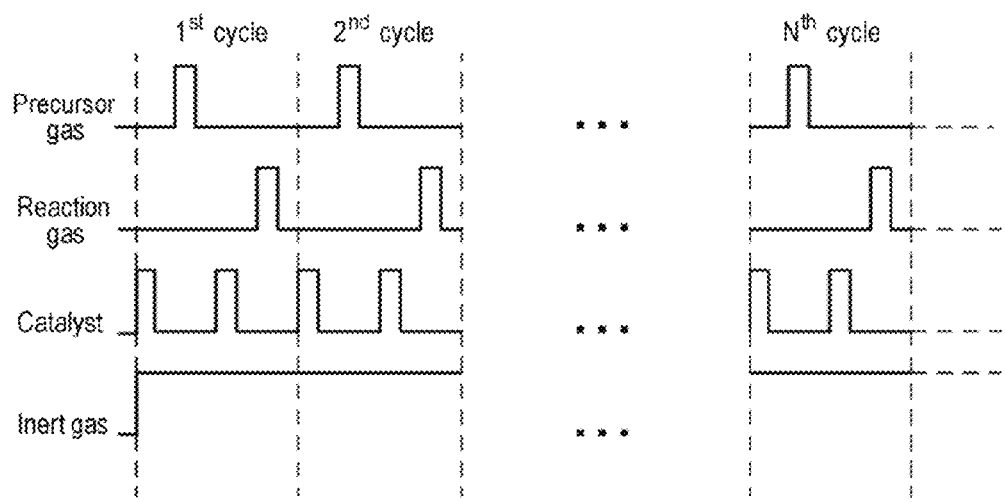
FIG. 6 is a view illustrating a time chart of a film forming sequence according to a third embodiment of the present disclosure.

As for a third embodiment, points differing from those of the first embodiment will be described below while omitting detailed descriptions on the same points as those of the first embodiment. In the first embodiment, there has been described an example in which the TiN film is formed by sequentially and time-divisionally (non-simultaneously, intermittently or pulse-wise) performing the TDEAT gas supply step, the residual gas removal step, the BCl₃ gas supply step, the residual gas removal step, the NH₃ gas supply step and the residual gas removal step. This embodiment differs from the first embodiment in that, as illustrated in FIG. 6 and as will be described below, when forming the TiN film, a cycle including a BCl₃ gas supply step, a residual gas removal step, a TDEAT gas supply step, a residual gas removal step, an NH₃ gas supply step and a residual gas removal step is sequentially and time-divisionally performed n times (where n is an integer of one or more). Processing procedures and processing conditions in the respective steps are substantially the same as those of the first embodiment.

[BCl₃→P/V→TDEAT→P/V→NH₃→P/V]×n ⇒ TiN

According to this embodiment, it is possible to achieve effects similar to those of the first embodiment. In addition, according to this embodiment, in the second and subsequent cycles, the catalyst is supplied after the TiN film is formed by supplying the reaction gas. Thus, it is possible to achieve an effect in that, if the reaction byproduct formed at the time of supplying the reaction gas remains on the substrate, the catalyst reacts with the reaction byproduct, thereby removing the reaction byproduct from the substrate.

Modification 1 of the Third Embodiment

In the third embodiment, there has been described an example in which the BCl₃ gas, which is the compound having an electron withdrawing group, is used as the catalyst. When performing the aforementioned cycle twice or more, it may be possible to use, as the catalyst, a compound having an electron donating group, specifically a salt-based gas, more specifically a Lewis base, for example, pyridine as described below. By using the compound having an electron donating group, in the second cycle, the byproduct formed at the NH₃ gas supply step of the first cycle and remaining in the TiN layer formed on each of the wafers 200 reacts with (is bonded to) the compound having an electron donating group. It is therefore possible to desorb the byproduct from the TiN layer formed on each of the wafers 200. According to this modification, it may be possible to achieve effects similar to those of the third embodiment. Furthermore, according to this modification, when performing the aforementioned cycle twice or more, the compound having an electron donating group is used as the catalyst. Thus, in the second cycle, the byproduct formed at the NH₃ gas supply step of the first cycle and remaining in the TiN layer formed on each of the wafers 200 reacts with (is bonded to) the compound having an electron donating group. It is therefore possible to achieve an effect of desorbing the byproduct from the TiN layer formed on each of the wafers 200.

[C$_5$H$_5$N→P/V→TDEAT→P/V→NH$_3$→P/V]×n ⇒ TiN

Fourth Embodiment of the Present Disclosure

Figure 7:
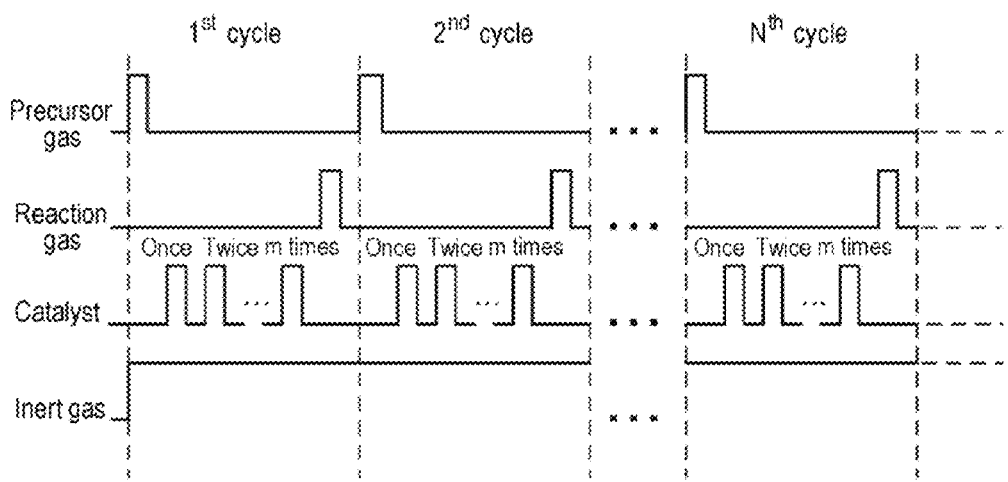
FIG. 7 is a view illustrating a time chart of a film forming sequence according to a fourth embodiment of the present disclosure.

As for a fourth embodiment, points differing from those of the first embodiment will be described below while omitting detailed descriptions on the same points as those of the first embodiment. In the first embodiment, there has been described an example in which the TiN film is formed by sequentially and time-divisionally (non-simultaneously, intermittently or pulse-wise) performing the TDEAT gas supply step, the residual gas removal step, the BCl$_3$ gas supply step, the residual gas removal step, the NH$_3$ gas supply step and the residual gas removal step. This embodiment differs from the first embodiment in that, as illustrated in FIG. 7 and as will be described below, when forming the TiN film, a BCl$_3$ gas supply step and a residual gas removal step are time-divisionally performed m times (where m is an integer of two or mores between the residual gas removal step following the TDEAT gas supply step and the NH$_3$ gas supply step. Processing procedures and processing conditions in the respective steps are substantially the same as those of the first embodiment.

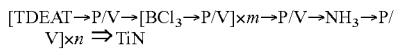
[TDEAT→P/V→[BCl$_3$→P/V]×m→P/V→NH$_3$→P/V]×n ⇒ TiN

According to this embodiment, it is possible to achieve effects similar to those of the first embodiment. In addition, according to tins embodiment, by supplying the compound having an electron withdrawing group as the catalyst having an action (catalytic action) of weakening the bond force between the main element of the adsorbed precursor molecules and the ligands in a state in which the precursor molecules are adsorbed onto the substrate, the ligands are brought into an easily desorbed state. Thereafter, the reaction gas is supplied onto the substrate to desorb the ligands brought into an easily desorbed state. It is therefore possible to improve the removal efficiency of the ligands and to restrain the ligands from remaining In the film as an impurity. In addition, since the main element and the reaction gas can be caused to react with each other, it is possible to form a high-quality film. For example, in the aforementioned embodiment, by supplying the BCl$_3$ gas as the compound having an electron withdrawing group in a state in which the molecules of the TDEAT gas as the precursor gas are adsorbed onto the substrate, —N(C$_2$H$_5$)$_2$ as a ligand is removed as HN(C$_2$H$_5$)$_2$ when the NH$_3$ gas is supplied. It is therefore possible to achieve an effect of suppressing —N(C$_2$H$_5$)$_2$ from remaining in the TiN film, thus suppressing an increase in the resistivity of the TiN film.

In addition, according to this embodiment, the catalyst supply step and the residual gas removal step are performed multiple times between the residual gas removal step following the precursor gas supply step and the reaction gas supply step. Thus, the ligands of the precursor molecules, which are not wholly adsorbed when performing the catalyst supply step once and which stays in a non-adsorbed state, can be adsorbed (buried) by performing the catalyst supply step multiple times. It is therefore possible to improve the adsorption rate and the adsorption uniformity of the BCl$_3$ gas. By improving the adsorption rate and the adsorption uniformity of the BCl$_3$ gas, the ligands easily removable when supplying the reaction gas exist in a large amount. It is therefore possible to achieve an effect of restraining the ligands from remaining in the film as an impurity.

Modification 1 of the Fourth Embodiment

In the fourth embodiment, the processing conditions (e.g., the supply amount and the supply time of the BCl$_3$ gas) at the BCl$_3$ gas supply step may be respectively changed during the m times. For example, when the BCl$_3$ gas supply step and the residual gas removal step are performed m times, the supply amount of the BCl$_3$ gas may be gradually reduced. According to modification 1 of the fourth embodiment, it is possible to achieve effects similar to those of the sequence illustrated in FIG. 7. Furthermore, according to this modification, by gradually reducing the supply amount of the BCl$_3$ gas, the BCl$_3$ gas can be initially adsorbed to most of the ligands of the TDEAT molecules. Then, the BCl$_3$ gas can be efficiently adsorbed to the remaining non-adsorbed ligands. In addition, according to this modification, by gradually reducing the supply time of the BCl$_3$ gas, the BCl$_3$ gas can be initially adsorbed to most of the ligands of the TDEAT molecules. Then, the BCl$_3$ gas can be efficiently adsorbed to the remaining non-adsorbed ligands.

Modification 2 of the Fourth Embodiment

Figure 8:
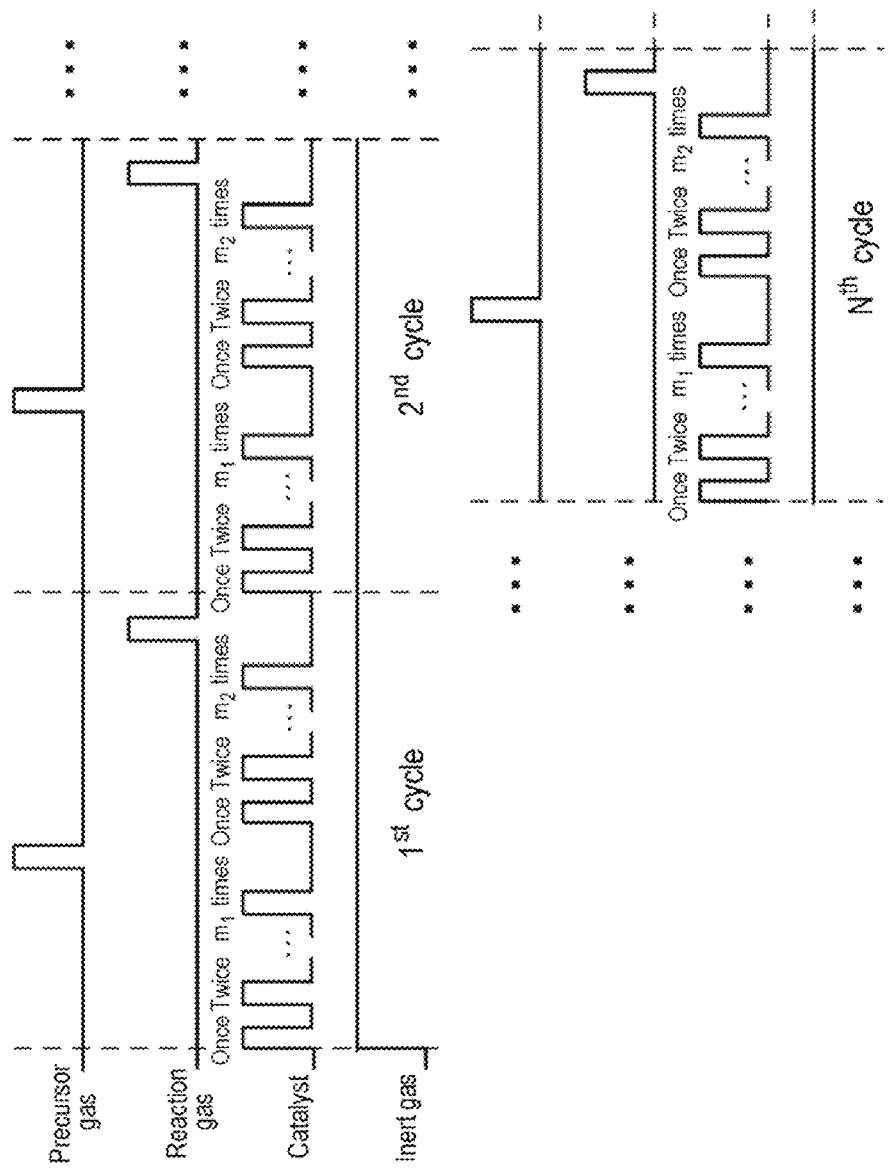
FIG. 8 is a view illustrating a time chart of a film forming sequence according to modification 2 of the fourth embodiment of the present disclosure.

In modification 2 of the fourth embodiment, as illustrated in FIG. 8 and as will be described below, a sequence obtained by combining the sequences of the second embodiment and the fourth embodiment is used. Specifically, when forming the TiN film, a cycle including the BCl$_3$ gas supply step and the residual gas removal step is sequentially and time-divisionally performed m$_1$ times (where m$_1$ is an integer of two or more). The TDEAT gas supply step and the residual gas removal step are performed. A cycle including the BCl$_3$ gas supply step and the residual gas removal step is sequentially and time-divisionally performed m$_2$ times (where m$_2$ is an integer of two or more). A cycle including the NH$_3$ gas supply step and the residual gas removal step is sequentially and time-divisionally performed n times (where n is an integer of one or more). Processing procedures and processing conditions in the respective steps are substantially the same as those of the first embodiment. According to modification 2 of the fourth embodiment, it is possible to achieve effects similar to those of the sequences illustrated is FIGS. 5 and 7.

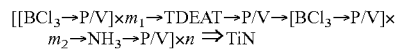
[[BCl$_3$→P/V]×m$_1$→TDEAT→P/V→[BCl$_3$→P/V]×m$_2$→NH$_3$→P/V]×n ⇒ TiN

Modification 3 of the Fourth Embodiments

In modification 3 of the fourth embodiment, as will be described below, a sequence obtained by combining the sequences of modification 1 of the second embodiment and the fourth embodiment is used. According to modification 3 of the fourth embodiment, it is possible to achieve effects similar to those of the sequences illustrated in FIGS. 5 and 7.

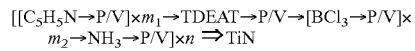
[[C$_5$H$_5$N→P/V]×m$_1$→TDEAT→P/V→[BCl$_3$→P/V]×m$_2$→NH$_3$→P/V]×n ⇒ TiN

Modification 4 of the Fourth Embodiment

Figure 9:
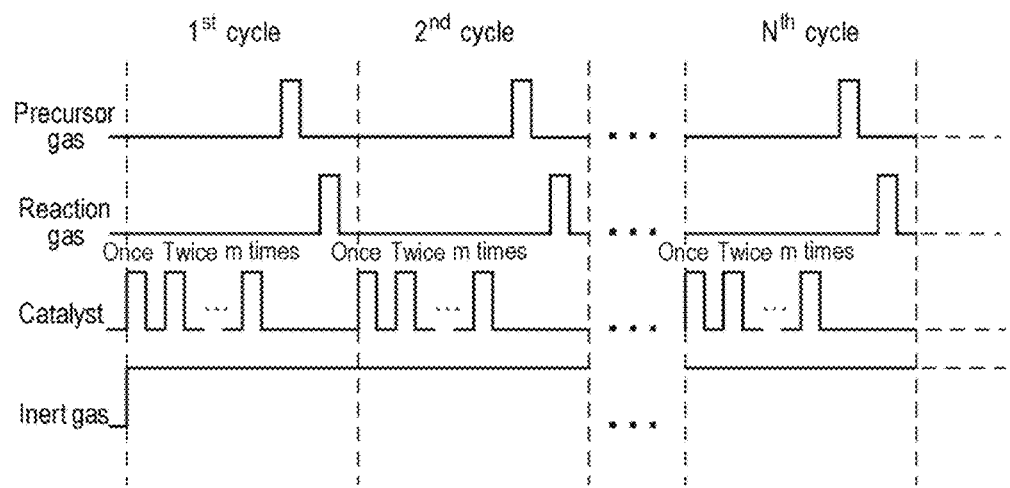
FIG. 9 is a view illustrating a time chart of a film forming sequence according to modification 3 of the fourth embodiment of the present disclosure.

In modification 4 of the fourth embodiment, as illustrated in FIG. 9, a sequence obtained by combining the sequences of the third embodiment and the fourth embodiment is used.

Specifically, when forming the TiN film, a cycle including the $BCl_3$ gas supply step and the residual gas removal step is sequentially and time-divisionally performed m times (where m is an integer of two or more). A cycle including the TDEAT gas supply step, the residual gas removal step, the $NH_3$ gas supply step and the residual gas removal step is sequentially and time-divisionally performed n times (where n is an integer of one or more). Processing procedures and processing conditions in the respective steps are substantially the same as those of the first embodiment. According to modification 4 of the fourth embodiment, it is possible to achieve effects similar to those of the sequences illustrated in FIGS. 6 and 7.

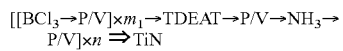

Modification 5 of the Fourth Embodiments

In modification 5 of the fourth embodiment, as will be described below, a sequence obtained by combining the sequences of modification 1 of the third embodiment and the fourth embodiment is used. According to modification 5 of the fourth embodiment, it is possible to achieve effects similar to those of the sequences illustrated in FIGS. 6 and 7.

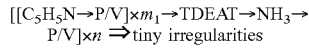

Fifth Embodiment of the Present Disclosure

Figure 10:
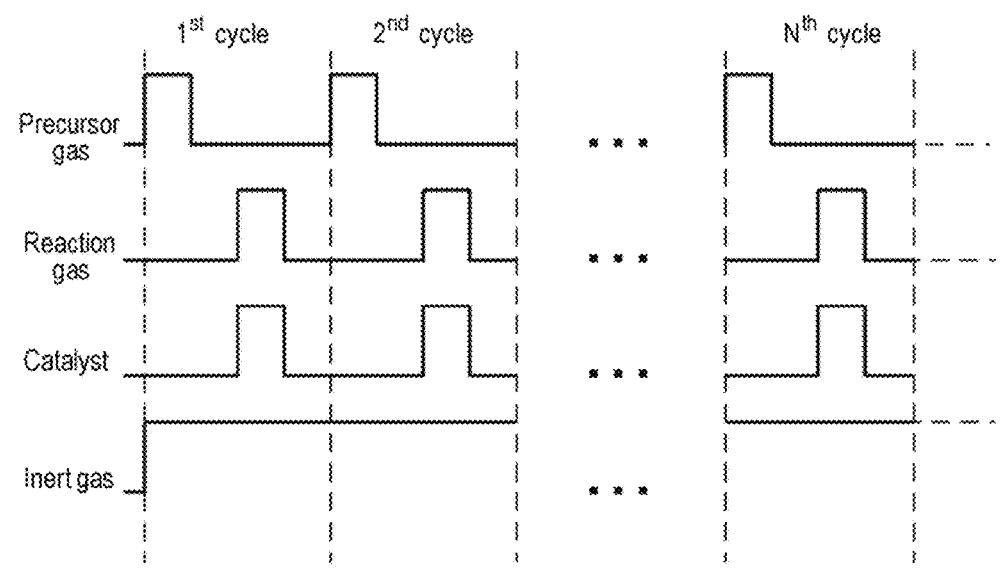
FIG. 10 is a view illustrating a time chart of a film forming sequence according to a fifth embodiment of the present disclosure.

As for a fifth embodiment, points differing from those of the first embodiment will be described below while omitting detailed descriptions on the same points as those of the first embodiment. This embodiment differs from the first embodiment in that, as illustrated in FIG. 10 and as will be described below, when forming the TiN film, a cycle including a TDEAT gas supply step, a residual gas removal step, an $NH_3$ gas/$BCl_3$ gas supply step of simultaneously supplying an $NH_3$ gas and a $BCl_3$ gas, and a residual gas removal step is sequentially and time-divisionally performed n times (where n is an integer of one or more). Processing procedures and processing conditions in the respective steps are substantially the same as those of the first embodiment. In the following descriptions, the expression "$NH_3/BCl_3$" means that the $NH_3$ gas and the $BCl_3$ gas are simultaneously supplied.

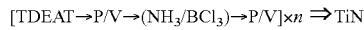

Figure 11:
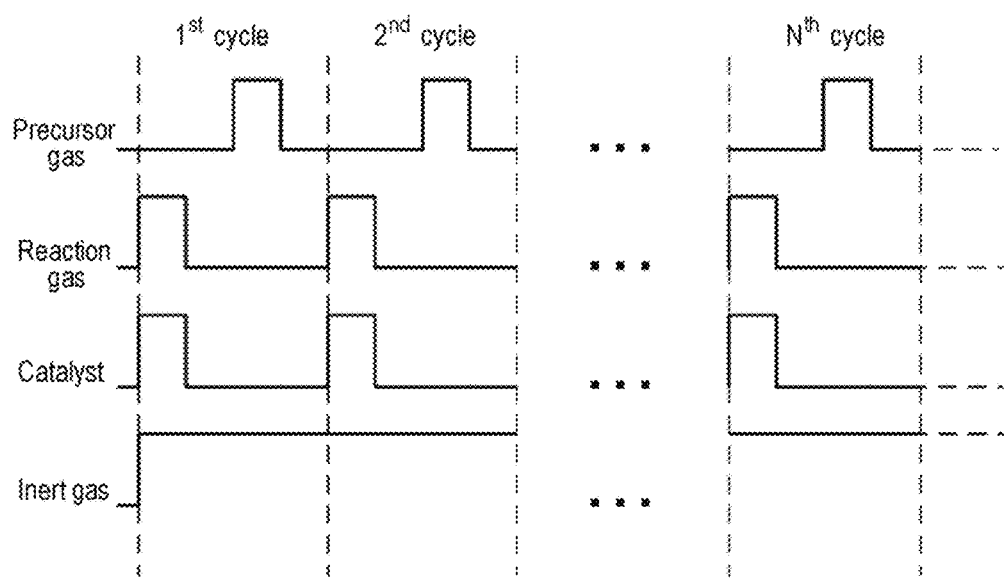
FIG. 11 is a view illustrating a time chart of a film forming sequence according to the fifth embodiment of the present disclosure.

As illustrated in FIG. 11 and as will be described below, when forming the TiN film, the TDEAT gas supply step and the $NH_3$ gas/$BCl_3$ gas supply step of simultaneously supplying the $NH_3$ gas and the $BCl_3$ gas, may be swapped with each other.

According to this embodiment, it is possible to achieve effects similar to those of the first embodiment. In addition, according to this embodiment, by supplying the compound basing an electron withdrawing group as the catalyst having an action (catalytic action) of weakening the bond force between the main element of the adsorbed precursor molecules and the ligands in a state in which the precursor molecules are adsorbed onto the substrate, the ligands axe brought into an easily desorbed state. Thereafter, the reaction gas is supplied onto the substrate to desorb the ligands brought into an easily desorbed state. It is therefore possible to improve the removal efficiency of the ligands and to restrain the ligands from remaining in the film as an impurity. In addition, since the main element and the reaction, gas can be caused to react with each other, it is possible to form a high-quality film. For example, in the aforementioned embodiment, by supplying the $BCl_3$ gas as the compound having an electron withdrawing group in a state in which the molecules of the TDEAT gas as the precursor gas are adsorbed onto the substrate, —$N(C_2H_5)_2$ as a ligand is removed as $HN(C_2H_5)_2$ when the $NH_3$ gas is supplied. It is therefore possible to achieve an effect of suppressing —$N(C_2H_5)_2$ from remaining, in the TiN film and an effect of suppressing an increase in the resistivity of the TiN film. Moreover, by simultaneously supplying the reaction gas and the catalyst, it is possible to achieve the effect of improving the processing efficiency, thus increasing the throughput.

Other Embodiments

The present disclosure is not limited to the aforementioned embodiments but may be differently modified without departing from the spirit thereof.

For example, the present disclosure may be applied to the following sequences.
(a) (TDEAT→P/V→$BCl_3$→$NH_3$→P/V)×n ⇒ TiN
(b) (TDEAT→P/V→($BCl_3$/$NH_3$)→P/V)×n ⇒ TiN
(c) (TDEAT→P/V→$BCl_3$→($BCl_3$/$NH_3$)→P/V)×n ⇒ TiN
(d)    (TDEAT→P/V→$BCl_3$→($BCl_3$/$NH_3$)→$BCl_3$→P/V)×n ⇒ TiN
(e) (TDEAT→P/V→($BCl_3$/$NH_3$)→P/V)×n ⇒ TiN
(f) ((TDEAT/$BCl_3$)→P/V→$NH_3$→P/V)×n ⇒ TiN
(g) ((TDEAT/$BCl_3$)→P/V→($BCl_3$/$NH_3$)→P/V)×n ⇒ tiny irregularities
(In items (a) to (g), P/V is an abbreviation of Purge/Vacuum and indicates a gas removal step)
(h) The precursor gas and the reaction gas are cyclically (pulse-wise) supplied in a state in which the catalyst is always supplied.

In the aforementioned embodiments, the gas used as the catalyst may be a gas having an electron withdrawing group, specifically an acid-based gas, more specifically a Lewis acid gas. The Lewis acid is a substance which receives electron pairs. Since the Lewis acid receives unpaired electrons of target atoms and removes the unpaired electrons from the target atoms, it may be used in the present disclosure.

In the aforementioned embodiments, $BCl_3$ has been described as an example of the compound having an electron withdrawing group. However, substances other than $BCl_3$ may be used as the compound having an electron withdrawing group. For example, as the compound having an electron withdrawing group, it may be possible to use a halide such as a boron-containing halide ($BX_3$ (X=F, I or Br)), a hydrogen-containing halide (HX (X=F, Cl, Br or I)) or a silicon-containing halide ($SiX_4$ (X=F, Cl, Br or I)), a metal-containing halide such as an aluminum-containing halide ($AlX_3$ (X=F, Cl, I or Br)) or a titanium-containing halide ($TiX_4$ (X=F, Cl, Br or I)), other halide such as $CX_4$ (X=F, Cl, Br or I) or the like, a diborane ($B_2H_6$), and a compound having a nitro group (—$NO_2$).

In the aforementioned embodiments, there has been described that pyridine ($C_5H_5N$), which is a salt-based gas and a Lewis basic gas, can be used as the catalyst, i.e., the compound having an electron donating group. However, substances other than pyridine may be used as the catalyst. For example, it may be possible to use pyrimidine ($C_4H_4N_2$), picoline ($C_6H_7N$) or the like.

In the aforementioned embodiments, there has been described an example in which one kind of catalyst is used, in one cycle. However, two or more kinds of catalysts may be selectively used in one cycle in conformity with the same purpose. For example, the byproduct may be initially taken by using pyridine, which is a Lewis base having an electron donating group, as a first catalyst. Then, she bond of the ligands of the precursor gas adsorbed onto the substrate may be weakened by using $BCl_3$, which is a Lewis acid having an electron withdrawing group, as a second catalyst.

In the aforementioned embodiments, there has been described an example in which Ti is used. The present disclosure is not limited to the aforementioned embodiments. The present disclosure may be applied to a case of forming a nitride film, an oxide film, a carbide film, a boride film, a metal film as a composite film thereof an insulation film or the like, which contains an element such as tantalum (Ta), tungsten (W), cobalt (Co), yttrium (Y), ruthenium (Ru), aluminum (Al), hafnium (Hf), zirconium (Zr), molybdenum (Mo), niobium (Nb), silicon (Si) or the like as an element other than Ti. When a B-containing halide such as $BCl_3$ or the like, or a B-containing gas such as $B_2H_6$ or the like is used as the catalyst, in view of the likelihood that B unintentionally remains in the film, the present disclosure may be applied to, particularly a case where a boride film or a boron nitride film, which contains B as a constituent element of the film, is formed. For example, the present disclosure may be applied in forming a silicon boron nitride film (SiBN film), a silicon boron carbonitride film (SiBCN film), tungsten boride film (WB film) or the like.

In the case of forming the films containing the aforementioned elements, in addition to the titanium (Ti)-containing gas, it may be possible to use, as the process gas, a tantalum (Ta)-containing gas, a tungsten (W)-containing gas, a cobalt (Co)-containing gas, a yttrium (Y)-containing gas, a ruthenium (Ru)-containing gas, an aluminum (Al)-containing gas, a hafnium (Hf)-containing gas, a zirconium (Zr)-containing gas, a molybdenum (Mo)-containing gas, a niobium (Nb)-containing gas, a silicon (Si)-containing gas or the like.

In the case of forming the films containing the aforementioned elements, in addition to TDEAT, it may be possible to use, as the organic precursor gas, for example, tetrakis (dimethylamino) titanium ($Ti[N(CH_3)_2]_4$, abbreviation: TDMAT), pentaethoxy tantalum ($Ta(OC_2H_5)_5$, abbreviation: PET), bis(tert-butylimino)bis(tert-butylamino)tungsten (($C_4H_9NH)_2W(C_4H_9N)_2$), tungsten hexacarbonyl ($W(CO)_6$), bis(ethylcyclopentadienyl) cobalt ($C_{14}H_{18}Co$), cobalt hexacarbonyl ($CoCO)_6$), tris(butylcyclopentadienyl) yttrium ($Y(C_5H_4CH_2(CH_2)_2CH_3)_3$), bis(ethylcyclopentadienyl) ruthenium ($C_{14}H_{18}Ru$), trimethyl aluminum (($CH_3)_3Al$, abbreviation: TMA), tetrakis(ethylmethylamino) hafnium ($Hf[N(CH_3)CH_2CH_3]_4$, abbreviation: TEMAH), tetrakis(dimethylamino) hafnium ($Hf[N(CH_3)_2]_4$, abbreviation: TDMAH), tetrakis(diethylamino) hafnium ($Hf[N(C_2H_5)_2]_4$, abbreviation: TDEAH), tetrakis(ethylmethylamino) zirconium ($Zr[N(CH_3)CH_2CH_3]_4$, abbreviation: TEMAZ), tetrakis(dimethylamino) zirconium ($Zr[N(CH_3)_2]_4$, abbreviation: TDMAZ), tetrakis(diethylamino) zirconium ($Zr[N(C_2H_5)_2]_4$, abbreviation: TDEAZ), tris(dimethylaminocyclopentadienyl) zirconium (($C_5H_5)Zr[N(CH_3)_2]_3$), bis(tributylamidebisdimethylamide) molybdenum (VI) (($NtBu)_2(NMe_2)_2Mo$), bis(cyclopentadienyl) molybdenum ($Cp_2MoH_2$), pentakis(dimethylamide) niobium ($Nb[N(CH_3)_2]_5$), tetrakis(dimethylamino) silane ($Si[N(CH_3)_2]_4$, abbreviation: 4DMAS), tris(dimethylamino) silane ($Si[N(CH_3)_2]_3H$, abbreviation: 3DMAS), bis(diethylamino) silane ($Si[N(C_2H_5)_2]_2H_2$, abbreviation: BDEAS), bis(tert-butylamino) silane ($SiH_2[NH(C_4H_9)]_2$, abbreviation: BTBAS) or the like.

As the nitriding/reducing agent, in addition to the $NH_3$ gas, it may be possible to use nitrogen ($N_2$) or nitrous oxide ($N_2O$). It may also be possible to use a hydrogen nitride-based gas such as a diazene ($N_2H_2$) gas, a hydrazine ($N_2H_4$) gas, an $N_3H_8$ gas or the like. As the reactant, in addition to these substances, it may be possible to use an amine-containing gas, namely an amine-based gas. As the amine-based gas, it may be possible to use a monomethyl amine ($CH_3NH_2$, abbreviation: MMA) gas, a dimethyl amine (($CH_3)_2NH$, abbreviation: DMA) gas, a trimethyl amine (($CH_3)_3N$, abbreviation: TMA) gas, a monomethyl amino ($C_2H_5NH_2$, abbreviation: MEA) gas, a diethyl amine (($C_2H_5)_2NH$, abbreviation: DEA) gas, a triethyl amine (($C_2H_5)_3N$, abbreviation: TEA) gas or the like. Furthermore, as the reactant, it may be possible to use a gas containing an organic hydrazine compound, namely an organic hydrazine-based gas. As the organic hydrazine-based gas, it may be possible to use a monomethyl hydrazine (($CH_3)HN_2H_2$, abbreviation: MMH) gas, a dimethyl hydrazine (($CH_3)_2N_2H_2$, abbreviation: DMH) gas, a trimethyl hydrazine (($CH_3)_2N_2(CH_3)H$, abbreviation: TMH) gas or the like.

As the inert gas, in addition to the $N_2$ gas, it may be possible to use a rare gas such as an argon (Ar) gas, a helium (He) gas, a neon (Ne) gas, a xenon (Xe) gas or the like.

The embodiments, modifications and applications described above may be used by appropriately combining them. At this time, processing conditions may be the same as, for example, the processing conditions of the aforementioned embodiments.

Recipes (e.g., programs in which processing procedures and processing conditions are written) used in processing a substrate may be prepared individually according to the processing contents (e.g., the kind, composition ratio, film quality, film thickness, processing procedure and processing condition of the film to be formed) and may be stored in the memory device 121c via a telecommunication line or the external memory device 123. In addition, at the start of the substrate process, the CPU 121a may properly select an appropriate process recipe from a plurality of process recipes stored in the memory device 121c according to the processing contents. This configuration enables a single substrate processing apparatus to form films of different kinds, composition ratios, film qualities and film thicknesses with enhanced reproducibility. In addition, this configuration makes it possible to reduce an operator's operation burden (a burden borne by an operator when inputting processing procedures and processing conditions) and to quickly start the substrate process while avoiding an operation error.

The recipes mentioned above not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type vertical substrate processing apparatus configured to process a plurality of substrates at a time, namely a processing furnace having a structure in which nozzles for supplying process gases are vertically installed within a single reaction tube and in which an exhaust port is formed in the lower portion of the reaction tube. However, the present disclosure may be applied to a case where films are formed using a processing furnace having another structure. For example, the present disclosure may be applied to a case where films are formed using a processing furnace having a structure which includes two reaction tubes with concentric cross sections (where the outer reaction tube will be called an outer tube and the inner reaction tube will be called an inner tube) and in which process gases flow from nozzles vertically installed within the inner tube toward an exhaust port opened in a sidewall of the outer tube in a position (line symmetry position) opposing the nozzles across the substrates. Furthermore, the process gases may not be supplied from the nozzles vertically installed within the inner tube but may be supplied from gas supply holes opened in a sidewall of the inner tube. In this case, the exhaust port opened in the outer tube may be formed along the height of a plurality of substrates stacked and accommodated within a process chamber. The shape of the exhaust port may be a hole shape or a slit shape.

In the aforementioned embodiments, there has been described an example in which films are formed using a batch-type substrate processing apparatus configured to process a plurality of substrates at a time. The present disclosure is not limited thereto but may be appropriately applied to, for example, a case where films are formed using a single-substrate-type substrate processing apparatus configured to process a single substrate or several substrates at a time. In addition, in the aforementioned embodiments, there has been described an example in which films are formed using a substrate processing apparatus provided with a hot-wall-type processing furnace. The present disclosure is not limited thereto but may be appropriately applied to a case where films are formed using a substrate processing apparatus provided with a cold-wall-type processing furnace. In these cases, processing procedures and processing conditions may be the same as, for example, the processing procedures and processing conditions of the aforementioned embodiments.

According to the present disclosure in some embodiments, it is possible to provide a technique capable of forming a high-quality thin film by increasing the removal efficiency of ligands contained in a precursor when a thin film is formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising: forming a film on a substrate by time-divisionally and sequentially performing:
   (a) supplying a compound having an electron donating group to the substrate;
   (b) supplying a precursor gas to the substrate and causing precursor molecules, which are contained in the precursor gas and which contains a main element and ligands, to be adsorbed onto the substrate;
   (c) supplying a compound containing an electron withdrawing group to the substrate onto which the precursor molecules are adsorbed, and causing the compound containing the electron withdrawing group to be adsorbed to the ligands contained in the precursor molecules; and
   (d) supplying a reaction gas to the substrate onto which the precursor molecules and the compound containing the electron withdrawing group are adsorbed, causing the ligands and the compound containing the electron withdrawing group to be desorbed from the substrate, and causing the main element contained in the precursor molecules to react with the reaction gas.

2. The method of claim 1, wherein the compound containing the electron withdrawing group is one of a Lewis acid gas containing at least one compound selected from a group consisting of a boron-containing halide ($BX_3$ (X=F, I or Br)), a hydrogen-containing halide (HX (X=F, Cl, Br or I)), a silicon-containing halide ($SiX_4$ (X=F, Cl, Br or I)) as a halide, an aluminum-containing halide ($AlX_3$ (X=F, Cl, I or Br)), a titanium-containing halide ($TiX_4$ (X=F, Cl, Br or I)) as a metal-containing halide, other halide such as $CX_4$ (X=F, Cl, Br or I) or the like, a diborane ($B_2H_6$), a compound having a nitro group ($—NO_2$), and a gas containing at least one compound selected from a group consisting of $BCl_3$, $B_2H_6$ and $AlCl_3$.

3. The method of claim 1, wherein the precursor gas contains a metal element, and the film is a metal-containing film.

4. The method of claim 1, wherein the precursor gas includes an amine-based precursor gas as an organic precursor gas.

5. The method of claim 1, wherein the steps (a) to (d) are sequentially and repeatedly performed multiple times.

6. The method of claim 1, further comprising: after the step (b), exhausting the precursor gas.

7. The method of claim 1, wherein each of the steps are performed under a non-plasma condition.

8. The method of claim 1, wherein the compound having the electron donating group is one of pyridine, pyrimidine and picoline.

9. The method of claim 8, wherein the steps (a), (b), (c) and (d) are repeatedly performed multiple times in the named order.

10. The method of claim 8, further comprising: after the step (a) or the step (c), exhausting the compound having the electron withdrawing group or the compound having the electron donating group.

* * * * *